United States Patent

Kuinose et al.

[11] Patent Number: 5,249,349
[45] Date of Patent: Oct. 5, 1993

[54] PARTS MOUNTING DEVICE

[75] Inventors: Masaji Kuinose; Kazutaka Ikeda; Yutaka Yajima; Hideaki Takemoto, all of Osaka, Japan

[73] Assignee: Matsushita Electric Works, Ltd., Osaka, Japan

[21] Appl. No.: 816,573

[22] Filed: Jan. 3, 1992

[30] Foreign Application Priority Data

Jan. 24, 1991 [JP] Japan ................................. 3-119421
Sep. 11, 1991 [JP] Japan ................................. 3-313484

[51] Int. Cl.$^5$ ............................................. H05K 3/30
[52] U.S. Cl. ......................................... 29/721; 29/740; 29/833
[58] Field of Search ............... 29/721, 720, 740, 741, 29/705, 833

[56] References Cited

U.S. PATENT DOCUMENTS

| 4,608,494 | 8/1986 | Kobayashi et al. | 29/721 X |
| 5,003,692 | 4/1991 | Itumi et al. | 29/833 X |
| 5,079,834 | 1/1992 | Itagaki et al. | 29/833 X |
| 5,084,959 | 2/1992 | Ando et al. | 29/833 X |

Primary Examiner—Carl E. Hall
Attorney, Agent, or Firm—Leydig, Voit & Mayer

[57] ABSTRACT

A parts mounting device for precisely positioning parts and discriminating whether such position is proper wherein a recognition member recognizes parts and mounting lands on a printed circuit board and such information is processed to achieve a properly mounted part.

19 Claims, 22 Drawing Sheets

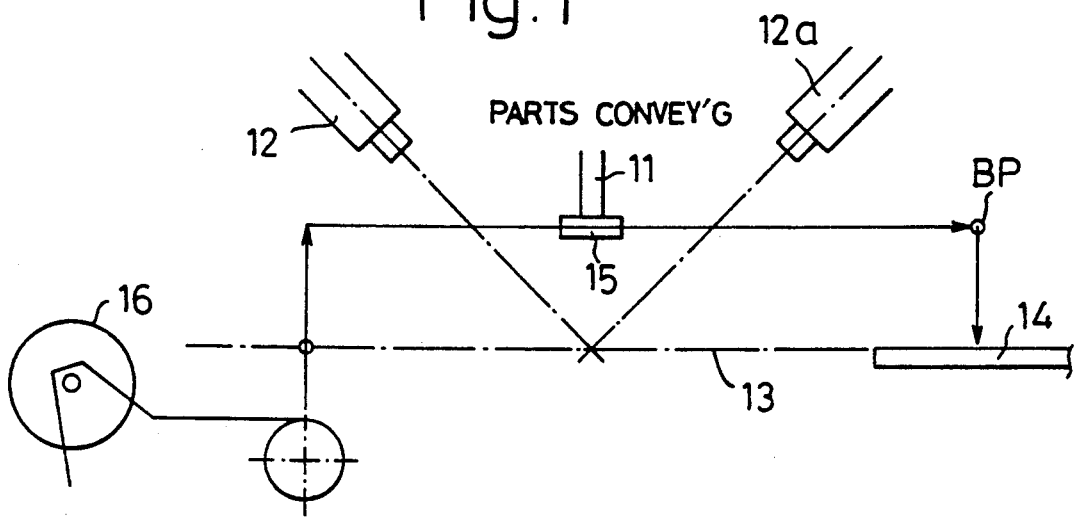
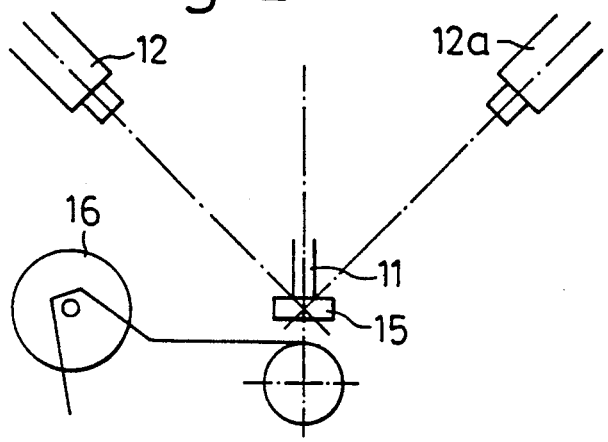
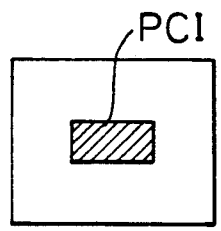
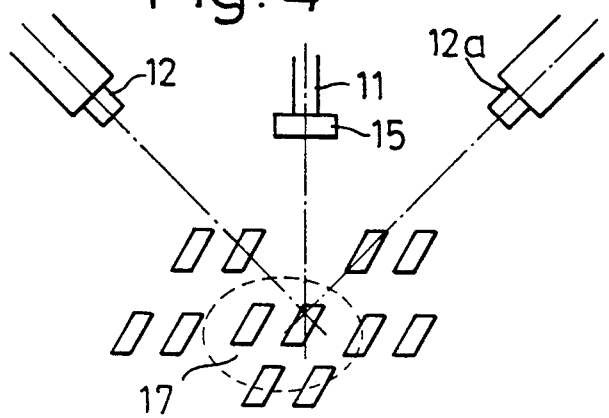
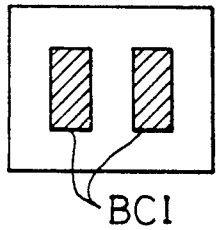

Fig. 30
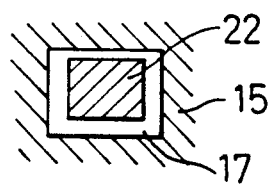
Fig. 31a        Fig. 31b
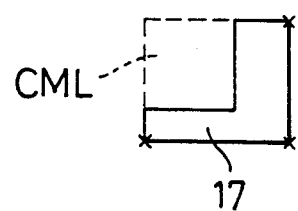   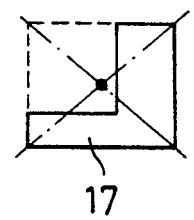

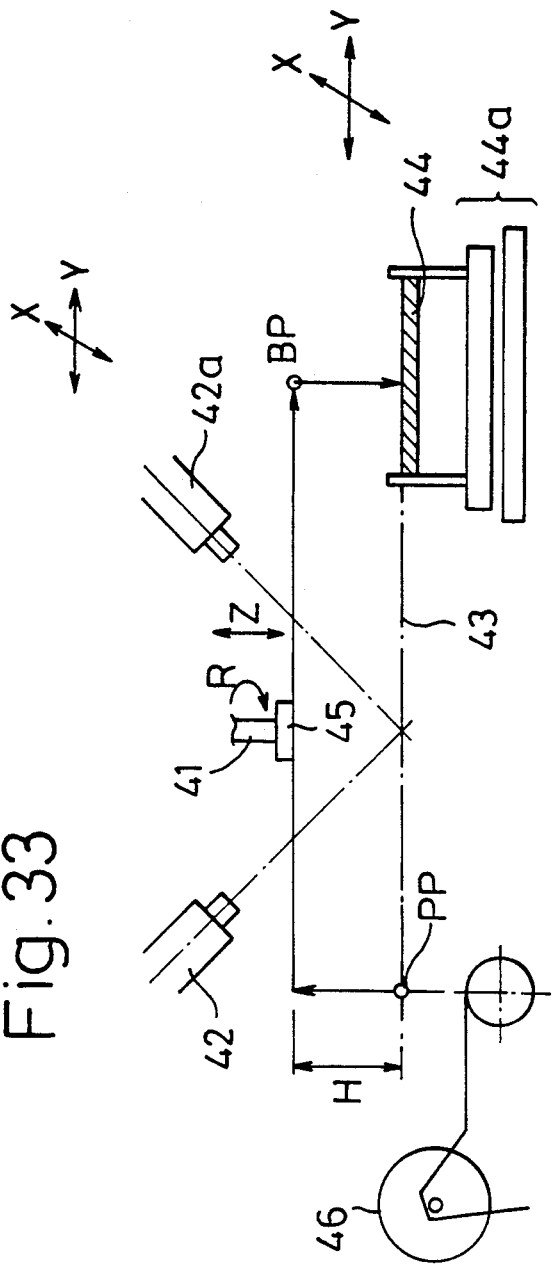
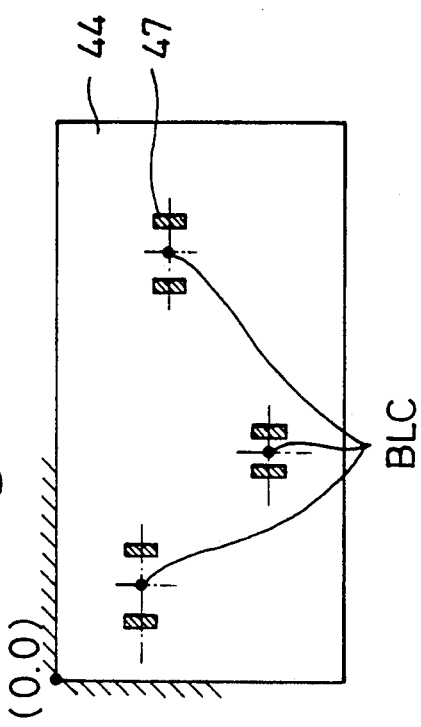
Fig. 33
Fig. 34

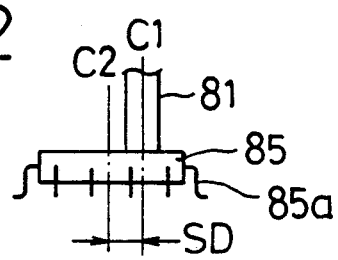
Fig. 42
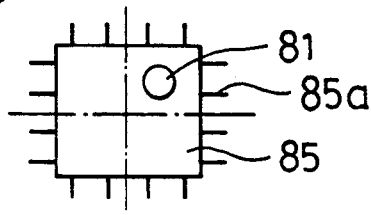
Fig. 43
Fig. 44
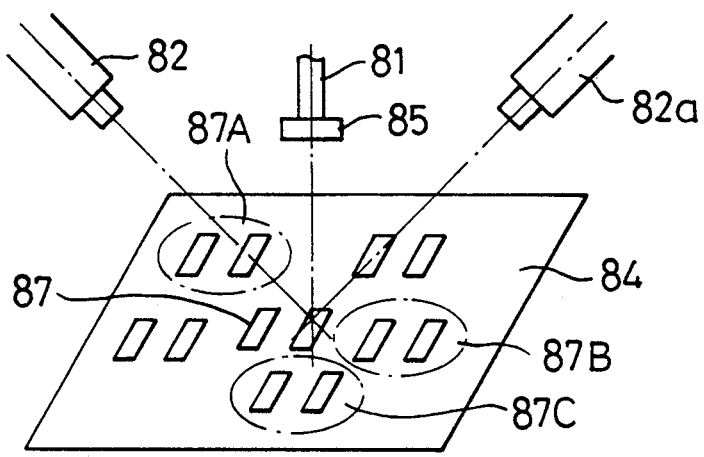
Fig. 45
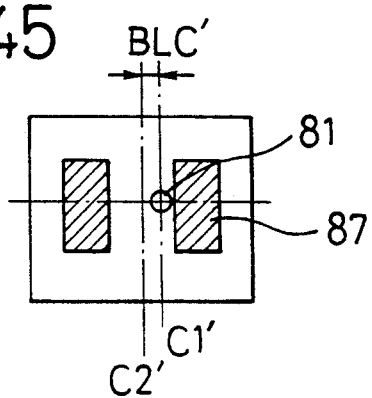

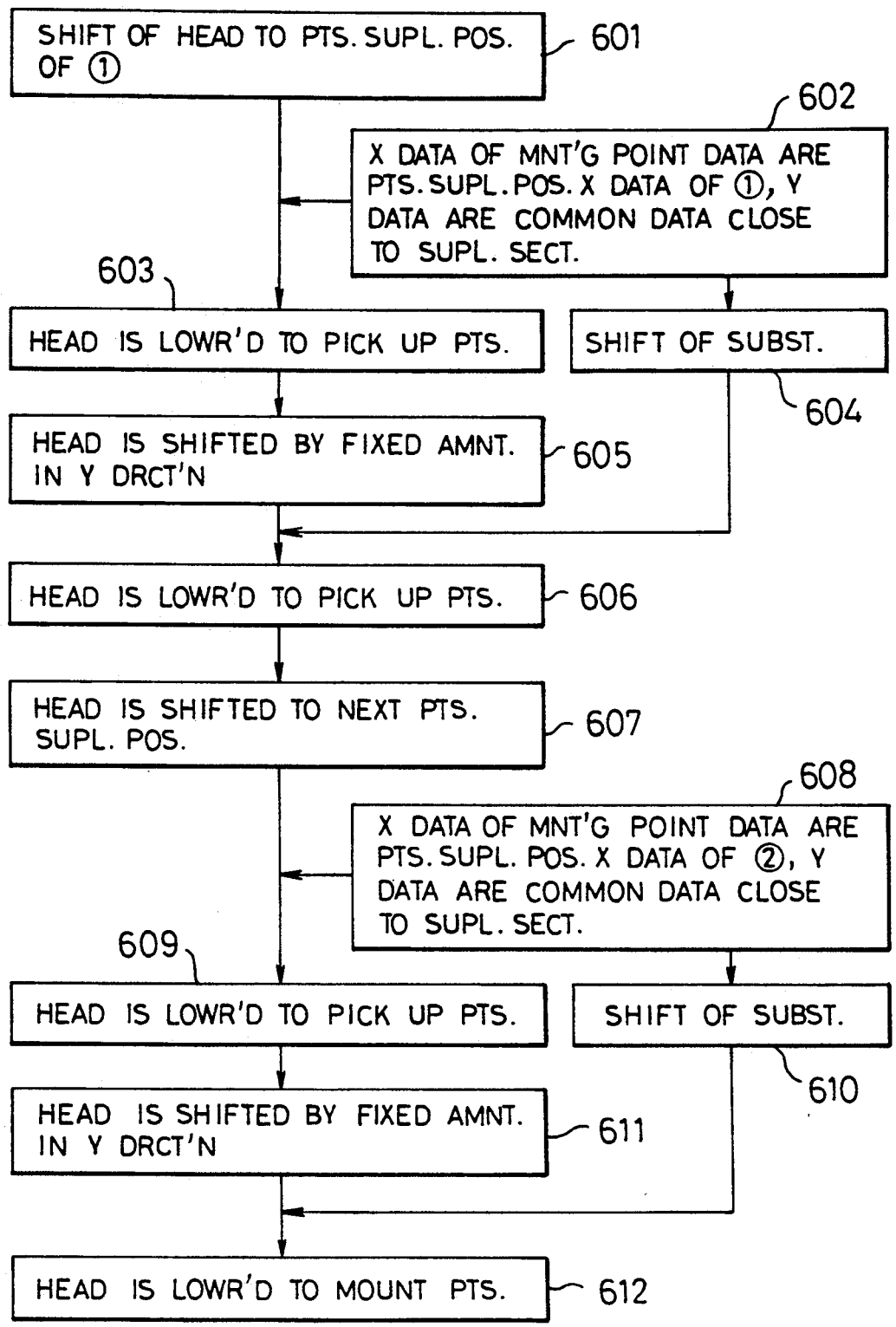

PARTS MOUNTING DEVICE

BACKGROUND OF THE INVENTION

This invention relates to parts mounting devices and, more particularly, to a parts mounting device capable of precisely positioning parts and discriminating whether the positioning is proper.

The parts mounting device may be utilized for precisely mounting electric and electronic parts onto a printed circuit board at predetermined mounting positions.

Description Of Related Art

Generally, in automatically mounting parts to a substrate, the parts are picked up using suction from a parts supply feeder supplied by means of a parts-conveying head. The parts are then conveyed to preliminarily set mounting positions on the board. When placing surface mounting parts having an extremely large number of leads, even a slight positional deviation causes errors in wiring because the adjacent leads are separated by a very small distance. Thus, the disposition of the mounting parts as well as the position on the board to which each of the parts is to be mounted are determined, the former disposition is aligned with the latter position, and the parts are precisely mounted to the predetermined positions on the board.

A parts mounting method has been suggested in Japanese Published Patent Application 60-1900 by Suzuki et. al. in which the center position and the rotary angle of the parts are determined from an image of the leads of the respective parts. Center position and rotary angle of a mounting pattern are also determined from an image of the board by means of two integrated circuit (IC) marks formed in the same manner as the mounting pattern. A parts-conveying head carrying each of the mounting parts is shifted and rotated in accordance with the positional relationship between the mounting part and the mounting pattern obtained so that the parts are mounted onto the predetermined positions on the board. When the mounting position of the parts is to be corrected in accordance with this known mounting method, however, it is difficult to precisely position the parts on the mounting pattern unless the positional relationship between the mounting pattern and the IC marks, as well as the positional relationship of an image take-up means with respect to the parts and the board, are accurately and precisely determined. Further, according to the known method, IC marks are required for every one of the mounting parts. For small chip parts or parts having leads with a small pitch that require very precise mounting, it is difficult to realize a high density mounting pattern.

Even when the positional relationship between the parts and the mounting pattern is accurately and precisely defined, there is still a risk that a positional deviation will occur immediately after mounting due to an inferior printing of adhesive or creamy solder for provisionally holding the parts on the mounting land. Thus, any positional deviation needs to be detected before a board with such an inferior mounting is conveyed to a reflow furnace or the like.

As the method for determining the proper position of mounted parts, Japanese Published Patent Application 63-90707 by Yotsuya, for example, suggests a method in which the proper mounting position is determined on the basis of positional relationship between the land images before and after the mounting. In Japanese Published Patent Application 1-309190, Okayaki has suggested a method for determining the proper mounting position in view of the amount of overlapping of the land images before and after the mounting. These known methods for determining the proper mounting position of parts are discovered upon inspection after the mounting. A reference position employed in a comparison for the determination will be a teaching or a standard substrate instead of a substrate to which the part is actually mounted. Accordingly, the method or a device for carrying out the method requires means for acknowledging any dimensional or positional fluctuation in the respective boards to be used for the mounting in practice.

Further, mounting of parts to the boards by means of a mounting device and the determination of the proper mounting position of the parts is performed by means of a visual device for inspecting the proper mounting position at a step after completely mounting all of the parts on the entirety of every board. With visual inspection, the inspection criterion may fluctuate between individual inspectors, depending on the extent of fatigue. Thus, it has been difficult to achieve precise inspection. Consequently, it has been customary to employ an inspecting device after all of the parts are mounted. However, the device must be furnished with input data, such as the mounting positions of the parts, the inspecting positions of the mounted parts, and so on. The device burdens an operator, increasing the labor and time required for preparing the input data so that it is difficult or impossible for the operator to perform the inspection when a variety of mounting patterns are involved.

It has been suggested that a camera be used to recognize the mounting parts and the board. Japanese Published Patent Application 63-168097 by Kaneda et. al. discloses switching the sight of a camera in accordance with the parts to be mounted. In practical applications of this method, larger sized parts are initially subjected to a rough recognition with a specific camera and, thereafter, to a fine adjustment by means of a camera with a smaller sight. Thus, the recognition work has to be performed twice and the operating process is excessively time-consuming.

In Japanese Published Patent Application 62-287109, Suzuki et. al. have suggested a method for positional alignment between the parts and their mounting positions on the board by extracting a specific pattern with respect to a specific configuration of an array of leads provided to each of the parts, extracting a pattern corresponding to shapes of an array of lands on the board, and measuring a relative position of each of the parts to the board. In executing the positional alignment between the parts and the substrate according to this method, a high degree of precision is required for the extractions of the arrays of the leads on the parts and of the lands on the board and for the positional alignment step or means therefor. Using this method, it is difficult to obtain self-alignment of the parts having leads due to the shape, weight, or like factors of the parts in the course of melting and solidifying creamy solder printed on the lands of the board. Burdens on the parts mounting device and surrounding equipment show a remarkable tendency to increase as the pitch of the leads of the parts decreases.

Mounting the parts by means of a so-called creamy solder printing process has also been suggested. In inspecting printed quality of creamy solder, however, it is difficult to determine the position of the mounting land when the printed area of the creamy solder is larger than the mounting land. It is also difficult to define the position where the creamy solder is to be printed with respect to the mounting land. When the printed area of the creamy solder is identical to the area of the mounting land, the mounting land is completely covered by the creamy solder so that the mounting land is difficult to recognize. Any positional deviation or insufficient thickness of the printed creamy solder also causes difficulty in recognizing the mounting land. In this respect, it may be possible to determine the proper position of the printed state of the creamy solder with respect to the mounting land by means of recognized position and area of the mounting land. In this method for the parts mounting, however, positional definition or alignment of the printing of the creamy solder with respect to the mounting land cannot be precisely carried out if the printed area of the solder is even slightly exceeded due to sags or runs at the edge portions of the creamy solder.

SUMMARY OF THE INVENTION

A primary object of the invention is, therefore, to provide a parts mounting device which is capable of eliminating the foregoing problems in the known techniques, mounting the parts with high precision, and real-time inspection of the mounted state with a definition of the positional relationship between the parts to be mounted and their mounting lands on a board.

Another object of the present invention is to provide a parts mounting device in which a parts recognizing camera is subjected to a positional shift in response to the parts, for recognition of corners of each part, and for a highly precise recognition performed only once.

Still another object of the present invention is to provide a parts mounting device which defines mounting positions of the parts as well as the proper positional determination of the printed creamy solder prior to mounting the parts with a recognizing means provided to a parts-conveying head included in the body of the parts mounting device.

According to the present invention, the above objects can be realized by a parts mounting device wherein a parts-conveying head for picking up each of the mounting parts from a parts supply station and conveying the parts picked up to a predetermined mounting position on a printed circuit board is provided with a recognition means and mutually corresponding characteristics of each of the parts and each of the mounting lands on the board are defined with respect to each of the mounting positions with the parts-conveying head in a reference position for attaining positional alignment between the respective parts and the respective mounting lands.

Other objects and advantages of the present invention will be made clear in the following description of the invention, detailed with reference to embodiments according to the present invention as shown in the accompanying drawings.

BRIEF DESCRIPTION OF THE DRAWINGS

FIG. 1 is an explanatory view for recognition and mounting operation in a parts mounting device according to the present invention;

FIG. 2 is an explanatory view of the operation of a recognition means at a parts recognizing point in the device according to the present invention;

FIG. 3 is a diagram showing a composite image of one of the mounting parts as obtained by the recognition means at the point of FIG. 2;

FIG. 4 is an explanatory view for the operation of the recognition means at a substrate recognizing point in the apparatus according to the present invention;

FIG. 5 is a diagram showing a composite image of the substrate recognized by the recognition means at the point of FIG. 4;

FIG. 30 is a diagram showing a state in which the creamy solder is printed on the land in the device according to the present invention;

FIGS. 31a and 31b, are showing an extracted image of the land in the device according to the present invention;

FIG. 33 is an explanatory view for a mounting operation in another embodiment of the parts mounting device according to the present invention;

FIG. 34 is a schematic view showing the relationship between the standard position and the mounting position on the board in the device according to the present invention;

FIGS. 42 and 43 are diagrams showing a positional shear between the center of the parts-conveying head in the device according to the present invention and the center of the mounting part having leads;

FIGS. 44 and 45 are diagrams showing a positional shear between the center of the parts-conveying head in the device according to the present invention and the center of the mounting land on the board;

FIG. 47 is a flow chart of a mounting process with the device according to the present invention in which the processing time is attempted to be shortened.

Figure 6:
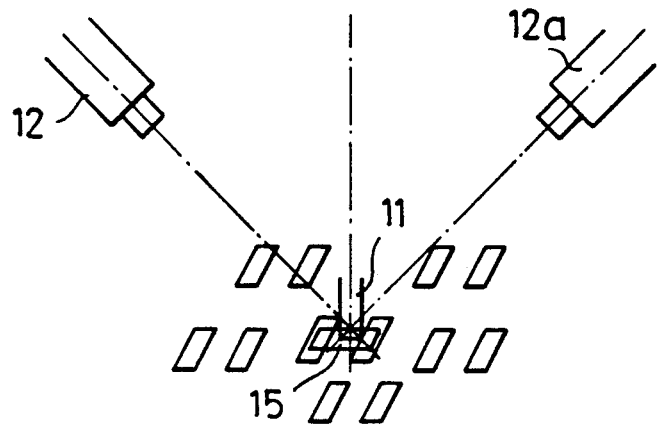
FIG. 6 is an explanatory view for a parts mounting operation in the device according to the present invention.

While the present invention will be explained with reference to the embodiments shown in the accompanying drawings, it should be appreciated that the intention is not to limit the invention only to the embodiments shown but, rather, to include all modifications, alterations, and equivalent arrangements possible with the scope of the appended claims.

DETAILED DESCRIPTION OF THE PREFERRED EMBODIMENTS

Referring to FIG. 1, a parts-conveying head 11 and cameras 12 and 12a are mounted to a common base (not shown) in a parts mounting device according to the present invention. The head 11 and the cameras 12 and 12a are displaceable in the X and Y directions. Further, the parts-conveying head 11 is also displaceable in vertical directions and axially rotatable, and two or four of the cameras 12 and 12a are respectively disposed to have a sight in the displacing direction of the conveying head 11 from diagonal directions with the head 11 as the center. Composing respective images obtained through a plurality of these cameras provides the advantage that the resolution of the sights of the cameras can be increased. Additional advantages include recognizing any side of a part that is behind the head 11 for one of the cameras with another camera on the opposite side of the head 11, obtaining information on the height of the object to be recognized, preventing the head 11 from entering into the sight of any one of the cameras 12 and 12a, and so on. The parts-conveying head 11 and the cameras 12 and 12a are collectively referred to as a conveying unit in the following description.

The conveying unit is shiftable in the X and Y directions but the cameras 12 and 12a are not shiftable in a vertical direction so that the cameras 12 and 12a can focus their image on a fixed plane 12, as shown in FIG. 1, during displacement in conjunction with the conveying unit. A printed circuit board 14 and mounting parts 15 are disposed on a focusing plane 13 for obtaining accurate and proper recognition. Background not desired to be viewed by the camera is eliminated from the focusing plane 13 of the cameras 12 and 12, effectively preventing influence from the background.

Next, steps of recognizing and mounting the parts with the foregoing arrangement will be described in conjunction with FIG. 2. Each of the mounting parts 15 is picked up using suction by the parts-conveying head 11 from a feeder 16. At the focusing plane 13, an image of the conveyed mounting part 15 is taken by the cameras 12 and 12a and the image information is stored in an associated frame memory (not shown). A composite image PCI of part 15 is shown in FIG. 3. Thereafter, the head 11 conveying the mounting part 15 is elevated to a displaceable height and is then laterally displaced over a board recognition point PB (shown in FIG. 1 above the printed circuit board 14). Simultaneously with this displacement, a positional recognition process is carried out to obtain positional information for the conveyed part 15 with the conveying head 11 in a reference position. At the board recognition point BP, while the head 11 is kept at the elevated height, cameras 12 and 12 are focused on mounting lands 17 on the board 14 in the focusing plane 13. Images of the mounting lands 17 in the respective cameras 12 and 12a are composed into a composite image BCI, as shown in FIG. 5. Since the composite image BCI is obtained through the same cameras 12 and 12a which obtained the composite image PCI of FIG. 3, the position of the mounting lands 17 on the board 14 are recognized with the parts-conveying head 11 in the reference position.

In this case, the positional information of the conveyed part 15 obtained as in FIG. 3 and the positional information of the board 14 including the mounting lands 17 are recognized with the parts-conveying head 11 in the reference position. Thus, absolute precision for the entire device is no longer required. A highly precise mounting is possible using means for aligning the conveyed part 15 with the mounting lands 17. That arrangement allows the conveyed part 15 and the mounting lands 17 to be recognized by common cameras having the parts-conveying head 11 at the center of the conveying unit, reducing errors and enabling highly precise mounting of the conveyed part 15, as shown in FIG. 6.

However, even when highly precise positional alignment is attained through the foregoing process, the mounting of parts cannot be precisely carried out due to the printed state of creamy solder, fluctuations in the suction of the parts-conveying head 11, and positional deviations or posture changes of the conveyed part 15 due to vibrations. Thus, inspection is required after the mounting.

Figure 7:
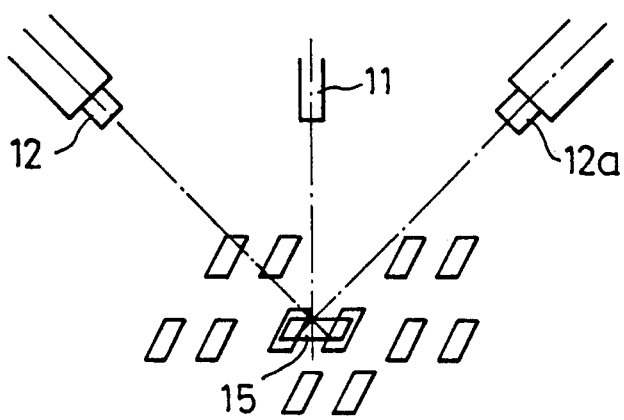
FIG. 7 is a explanatory view for a parts mounting operation in the device according to the present invention.
Figure 8:
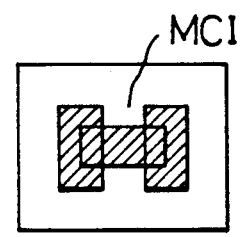
FIG. 8 is a diagram showing a composite image of the mounted state of the parts being inspected.
Figure 9:
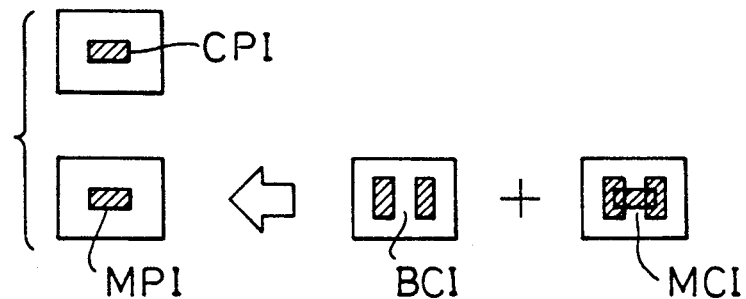
FIG. 9 is a diagram showing a recognized state of the parts after being mounted in the device according to the present invention.
Figure 18:
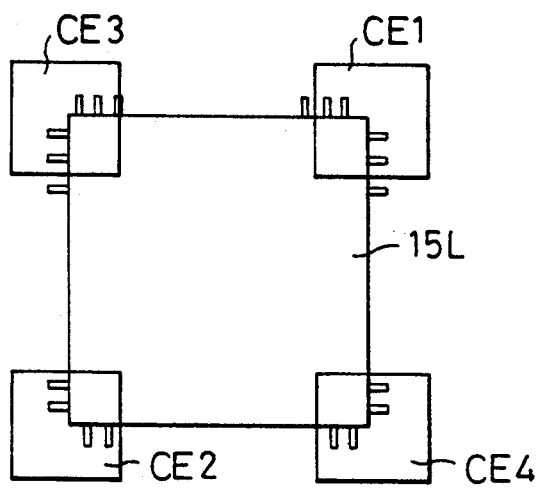
FIGS. 18 and 19 are explanatory views for sight arrangements for the purpose of recognizing a larger one of the mounting pars.

Referring to FIG. 7, a mounted state is shown in which the parts-conveying head 11 is lifted upward with the part 15 left on the mounting lands 17. A composite image MCI of the mounted state is obtained by the cameras 12 and 12a, as shown in FIG. 18. This composite image is stored in the frame memory (not shown), and the conveying unit is moved in preparation for the next conveying operation and the mounting of the next mounting part. An image comparison is carried out between the composite image BCI of FIG. 5 of the mounting lands 17 before the mounting and the composite image MCI of FIG. 8 of the lands after the mounting. An image MPI of the part after being mounted is obtained with the parts-conveying head 11 in the reference position, as shown in FIG. 9. With the MPI image, it is possible to recognize the position of the part 15 after being mounted, as shown in FIG. 9. By comparing this positional information with the positional information CPI of the part 15 before mounting (obtained from the composite image PCI of FIG. 3), it is possible to determine whether the mounted parts have been properly mounted. It is also possible to warn an operator of any abnormality and to provide information on any positional deviation to the next mounting data.

According to the present invention, the recognition function provided in the parts mounting device is utilized not only for positional alignment but also for inspection of the mounted state of the parts. Since the recognition operation can be executed immediately after the mounting, the inspection causes no time loss nor any post-stage operation for inspecting the mounted state with any mounting state inspector or the like. For this reason, any collection of required positional information for the mounting state inspector or the like is unnecessary so that the number of steps prior to setting of the solder or the like can be reduced and any careless positional deviation of the parts can be prevented. Through this method, it is possible to minimize the dimensions of a practical working line for mounting, to shorten required teaching time, grading, and type switching times, and also to reduce the number of defective parts. Thus, highly precise mounting of the parts can be performed through the recognition of parts 15 and mounting lands 17 by the common cameras 12 and 12a without requiring any special arrangement of the mounting state inspector or the like for carrying out the inspection after the mounting.

Figure 10A:
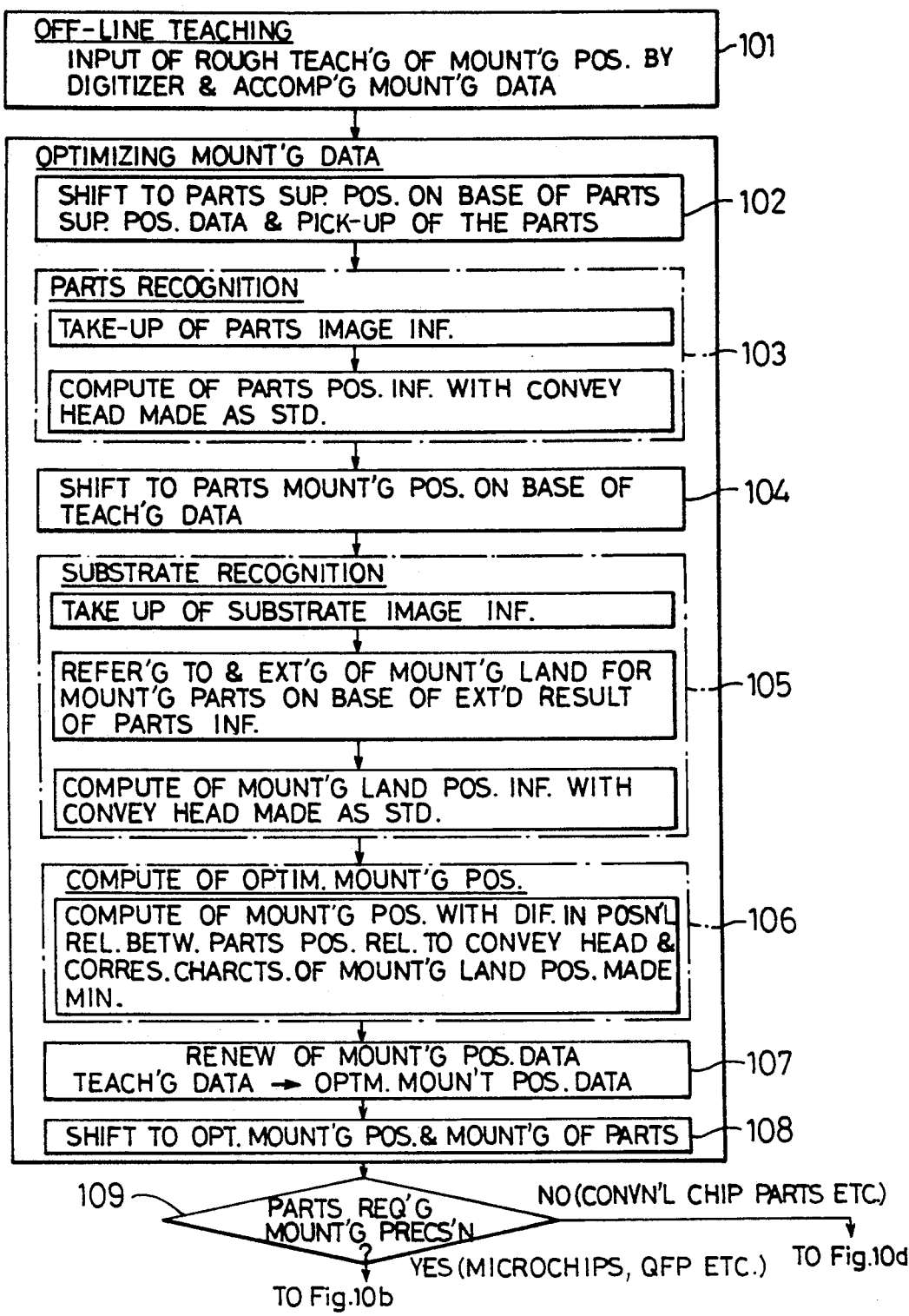
FIGS. 10 and 10a–10d are a flow chart of the operation from the parts mounting to inspection after the mounting in the device according to the present invention.
Figure 10B:
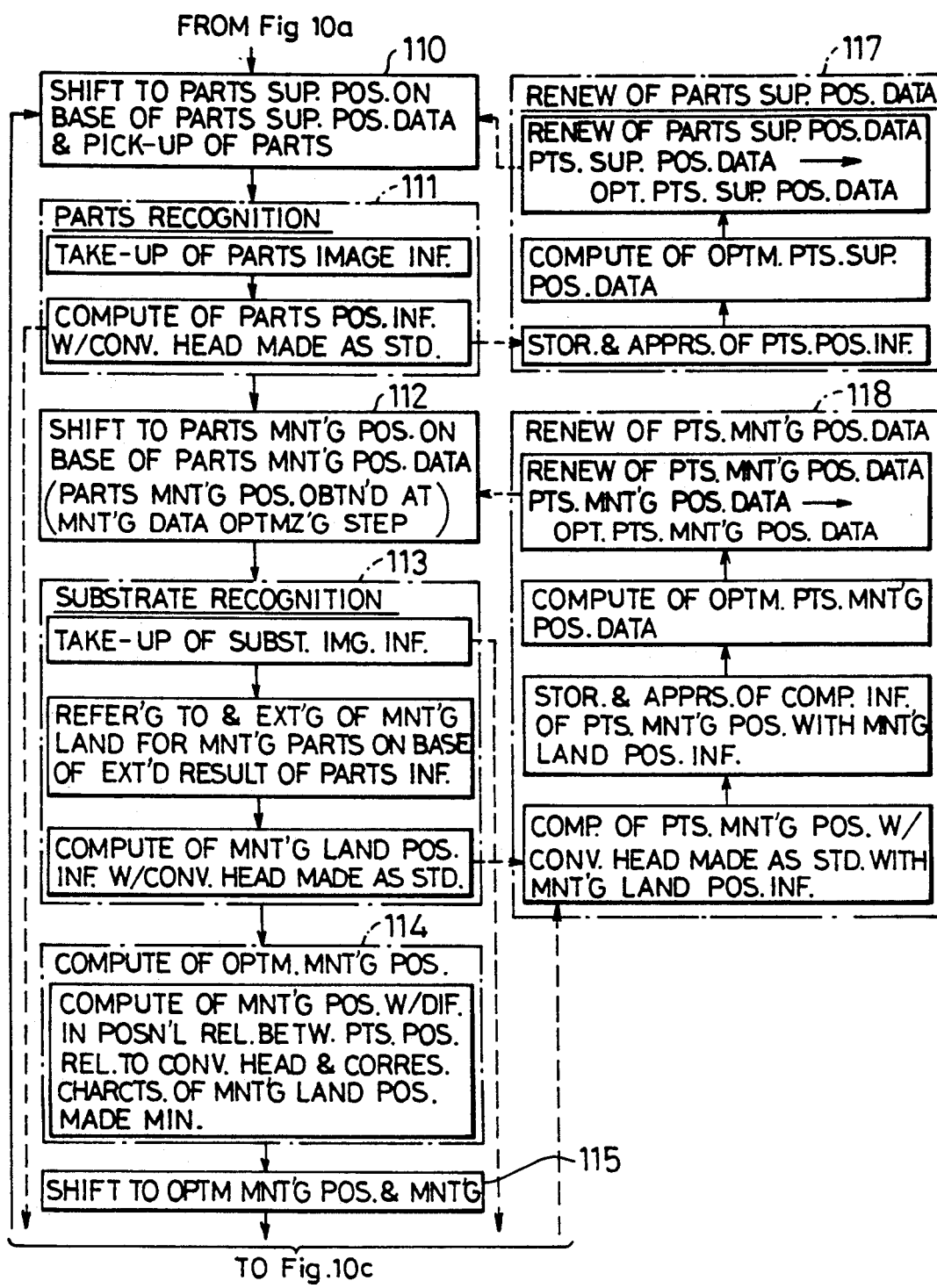
Figure 10C:
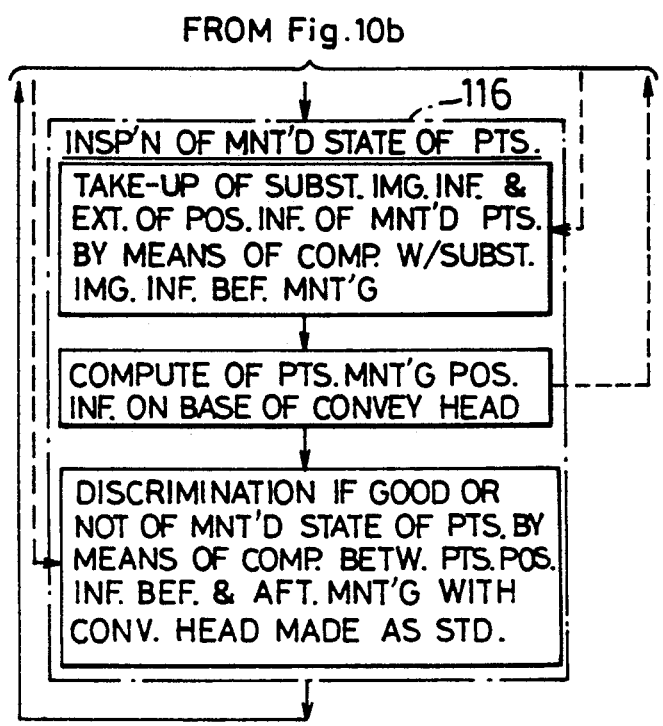
Figure 10:
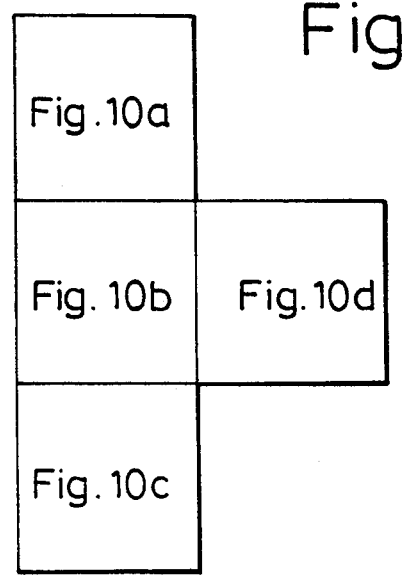
Figure 10D:
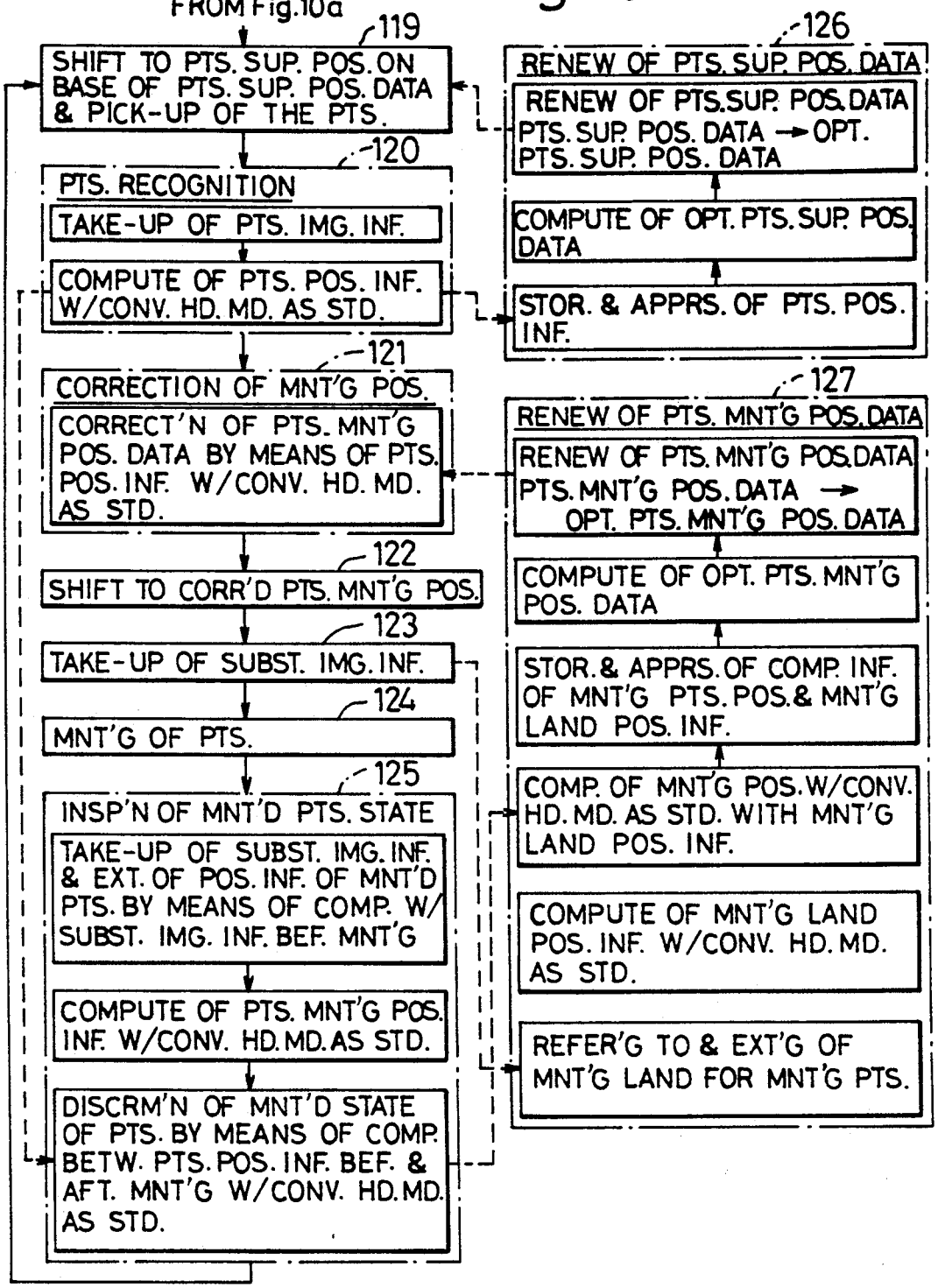

FIG. 10 shows an example of the entire operation from the mounting to the inspection. At a step 101, a rough teaching of the mounting position and accompanying mounting data is input and, sequentially, the operation is shifted to a step for optimizing the mounting data. In step 102, a shift to the parts supply position on the basis of part supply position data and picking up of a particular part are carried out. In step 103, parts image information is assembled and the parts position information is computed with the parts-conveying head used as a reference position. In step 104, the part is shifted to a parts mounting position on the basis of the teaching data. In step 105, the board image information is collected and the mounting land information is extracted for the picked-up part on the basis of the extracted result of the parts information, and the mounting land position information with the conveying head used as the reference position is computed. In step 106, an optimum mounting position is computed as the minimum difference in positional relationship between the parts position relative to the parts-conveying head and a corresponding difference of the mounting land positions. In step 108, a shift of the head to the optimum mounting position and mounting of the conveyed part are carried out.

In step 109, it is determined whether the particular mounting part is one requiring mounting precision so that, if YES, the operation shifts to a practical working step 110 or, if NO, the operation shifts to another practical working step 119; that is, YES is for microchips, QFP, and so on and NO is for conventional chip parts and so on.

In step 110, a shift of the head to the parts supply position on the basis of the parts supply position data and pick-up of a particular part are carried out. In step 111, image information of the picked up part is collected and the parts positional information with the with the parts-conveying head in the reference position is computed. The parts positional information obtained is also employed in step 117 for a renewal of part supply positional data and the renewed data are input into the above step 110. In step 112, a shift to the parts mounting position on the basis of the parts mounting positional data is performed. Step 113 includes collecting image information on the printed circuit substrate or board, referring to and extracting a particular mounting land or lands for the picked up part on the basis of the extracted result of the parts information, and computing the mounting land positional information with the conveying head in the reference position. The mounting land positional information computed here is also employ in step 118 for renewing the parts mounting positional data and the renewed data are input into the above-mentioned step 112. In step 114, an optimum mounting position is computed as the minimum difference in positional relationship between the parts position relative to the conveying head and a corresponding difference of the mounting land position. In step 115, a shift to the optimum mounting position and a mounting of the conveyed part are carried out. In step 116, board image information is collected and positional information of the mounted part is computed by comparing the board image information before and after the mounting. That computation of the parts mounting positional information is performed with the conveying head in the reference position. Determination of the proper mounting position of the part is accomplished through a comparison between the parts positional information before and after the mounting with the conveying head in the reference position.

When the conveyed part does not require high precision mounting, the operation at step 119 includes a shift to the parts supply position on the basis of the parts supply position data as well as pick-up of a particular part. In step 120, the parts image information is collected and the parts positional information is computed with the conveying head in the reference position. The positional information computed here is also employed for a renewal at step 126 of parts supply positional data and the renewed data are input to the step 119. In step 121, correction of the parts mounting positional data is carried out by means of the parts positional information with the conveying head in the reference position. In steps 122 through 124, a shift of the head to a corresponding parts mounting position, collection of board image information, and mounting of the conveyed part to a position are carried out. In step 125, collection of board image information as well as extraction of the positional information of the mounted parts through a comparison with the board image information before mounting, computing the parts mounting positional information with the conveying head in the reference position, and determination of the propriety of the mounting state of the part through a comparison between the parts position information before and after the mounting with the conveying head in the reference position is carried out. The board image information obtained at step 123 and the parts mounting positional information obtained at step 125 are employed in step 127 for renewal of the parts mounting positional data and the renewed data are input to the step 121.

Figure 11:
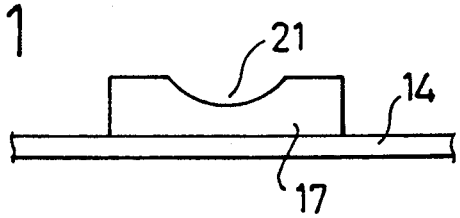
FIG. 11 is an explanatory view for a printed circuit board applied to the device according to the present invention for mounting the parts.
Figure 12:
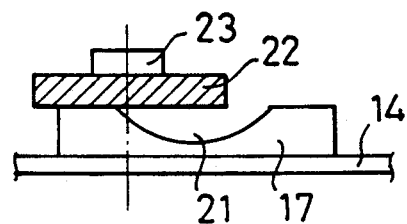
FIGS. 12 and 13 are diagrams showing the self-alignment effect attained in the device of the present invention.
Figure 13:
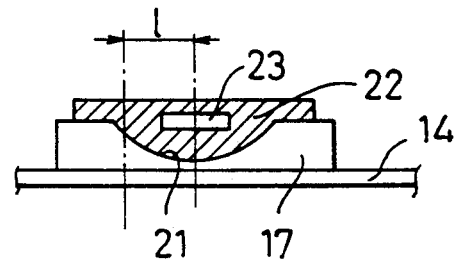

FIGS. 11-15 show examples of the printed circuit substrate or board for mounting parts which is employed in the present invention. More specifically, the respective land 17 on the board 14 is formed to have a dent 21 in the center of the top surface, as shown in FIG. 11. A creamy solder 22 is placed on the land 17, as shown in FIG. 12, prior to mounting the part 15 thereon. Next, the printed creamy solder is melted by means of, for example, a reflow furnace (not shown) or the like. The melted and/or fluidized solder 22 flows into the dent 21, and the mounting part 15 shifts into a position fully aligned with the dent 21, as shown in FIG. 13. Self-alignment can be effectively realized using this process. When the mounting part is provided with leads 23, each lead 23 follows the flowing movement of the printed solder 22 into the dent 21 to achieve a shift by a length component l. Thus, the lead 23 can be positioned in the center of the dent 21 and covered by the solder 22 whereby adhesion between the solder 22 and the lead 23 is remarkably increased. For further promotion of selfalignment of the mounting part with the respective land 17, it may be possible to provide a vibrator in the reflow furnace to vibrate the board 14. When it is desired that the mounting part 15 or its lead 23 be precisely mounted at the predetermined position of the lands 17 on the board 14, it is only necessary that a dent 21 be provided at the predetermined position.

Figure 14:
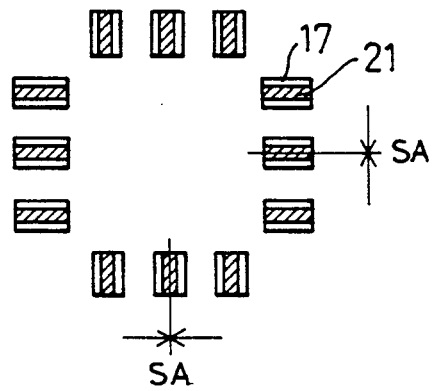
FIG. 14 is an explanatory view for a land arrangement with respect to one of the parts which has leads provided in four directions.
Figure 15:
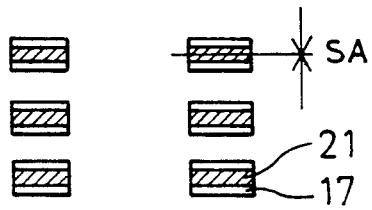
FIG. 15 is an explanatory view for a land arrangement with respect to one of the parts which has leads in two direction.

In practice, the dents 21 formed in the mounting lands 17 are provided in accordance with the external contour or formation of the mounting part so that, when the mounting part has leads extending in four directions, the dents 21 will lie in two transverse directions, as shown in FIG. 14. When the mounting part has leads extending in two opposite directions, the dents 21 will lie in a single direction, as shown in FIG. 15. In practice, the number of dents is determined by the weight of the mounting part 15. Thus, it is selectively determined whether a dent is provided to all of the lands 17 or only to one or more of them. In the arrangement shown in FIGS. 14 and 15, self-alignment is promoted in the direction of arrows SA toward the centers of the respective dents.

Figure 16:
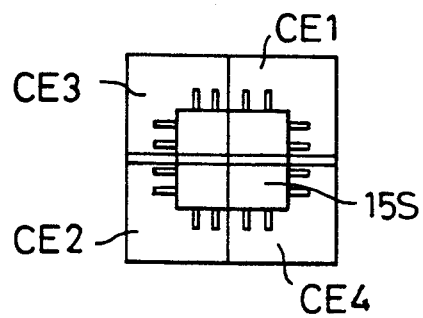
FIGS. 16 and 17 are explanatory views for sight arrangements for the purpose of recognizing a smaller one of the mounting parts.
Figure 17:
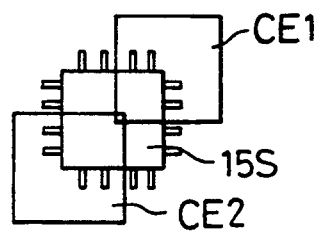
Figure 19:
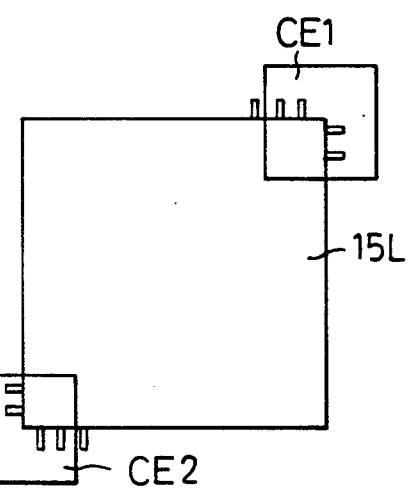
Figure 20:
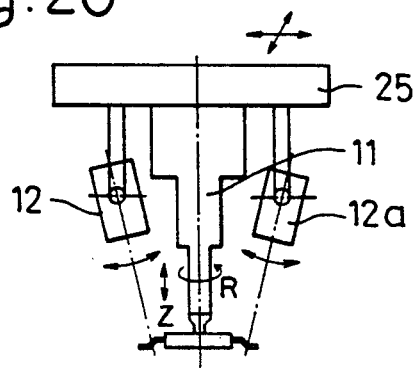
FIG. 20 is an explanatory view for the operation of diagonally-movable cameras employed in the device according to the present invention.
Figure 21:
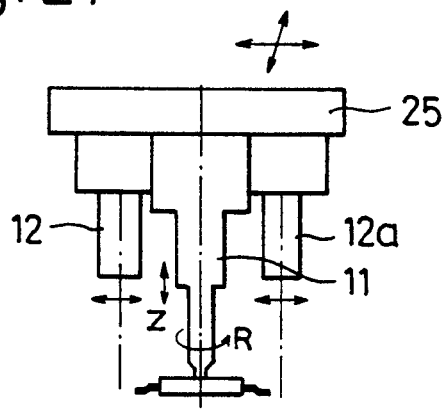
FIG. 21 is an explanatory view for the operation of horizontally-movable cameras employed in the device of the present invention.

For a small-sized mounting part 15S, as shown in FIG. 16, the device is provided with four cameras for defining four fields of sight CE1 to CE4. This divides the images of the mounting part 15S into four corners of the part 15S which is rectangular in plan view with each corner edge disposed in the center of each divided image. Alternatively, as shown in FIG. 17, at least two cameras are provided to define two fields of sight CE1 and CE2 for taking two divided images at two corners of the part 15S with the corner edge disposed in the center of each of the divided images. For a large-sized mounting part 15L, as shown in FIG. 18, four fields of sight CE1-CE4 are provided by means of four cameras for taking four divided images of the four corners of the part 15L. Alternatively, as shown in FIG. 19, two fields of sight CE1 and CE2 are provided by two of the cameras for taking two divided images at two corners of the part 15L. The cameras 12 and 12a in the present instance are sequentially shiftable, and the images at the respective corners of the mounting parts varying in size from the smallest to the largest as well as corresponding images of lands or circuit patterns on the board can be smoothly taken. In order to accomplish these functions, mechanisms as shown in FIGS. 20 and 21 are employed. In the mechanism shown in FIG. 20, a base 25 of the conveying unit is mounted to an X-Y table and the parts-conveying head 11 is mounted to the center of the base 25 to be operable in the vertical direction of arrow Z and in the rotary direction of arrow R. With head 11 at the center, two (as shown in the drawing) or four of the cameras 12 and 12a are mounted to the base and around the head 11. While these cameras are positioned at a fixed height relative to the base 25, they are rotatable to a small extent for shifting their field of sight properly. In another mechanism, shown in FIG. 21, the cameras are provided for interlocking shifting with the vertical and rotary operations in the directions of the arrows Z and R of the parts-conveying head 11.

Figure 22:
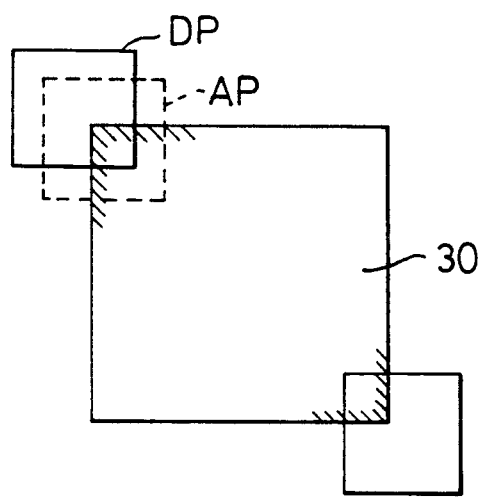
FIG. 22 is an explanatory view for a position-confirming operation by means of a camera in the device according to the present invention.
Figure 23:
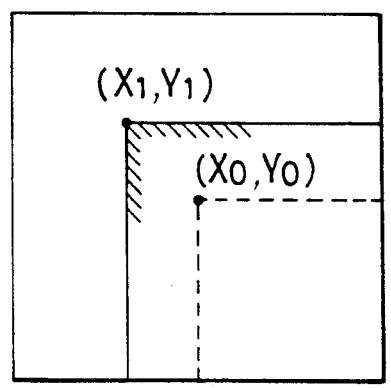
FIG. 23 is an explanatory view for a jig recognition image by means of the cameras in the device according to the present invention.

For the purpose of correcting recognition of the mounting parts and of the board with the fields of sight of the respective cameras used in the mechanism of FIGS. 20 or 21, for example, it is necessary to accurately maintain positional relationship between the respective field of sight. To recognize the camera positions, a correction jig 30, as shown in FIG. 22, is employed. More specifically, any difference between a desired position DP and an actual position AP can be obtained by means of the cameras with the correction jig 30 used to provide a recognition position with a corner of the jig. With reference to FIG. 23, a top point (X1, Y1) of a solid line is a top point of an image of the actual jig 30 while a top point X0, Y0) of a broken line is an initial recognition position. Here, differences between these top points $DX = X1-X0$ and $DY = Y1-Y0$ are added to the recognition correction so that the positional relationship between the cameras can be corrected. When this camera position confirmation is carried out upon exchange of the parts-conveying head 11, it is possible to prevent any influence on the operating cycle of the mechanism.

Figure 24:
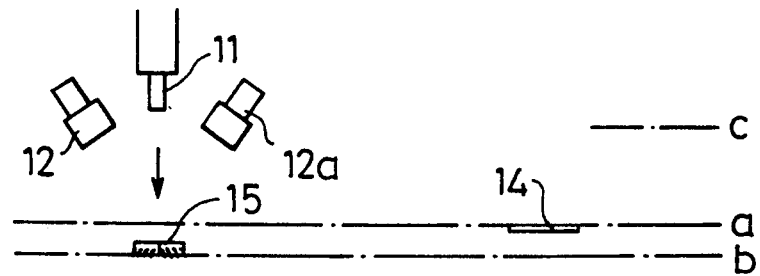
FIG. 24 is a diagram showing positional relationship between a parts lifting position and a suction head in the device according to the present invention.
Figure 25A:
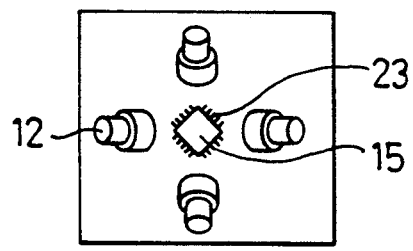
FIGS. 25a and 25b are explanatory views for a state of recognizing the leads of one of the parts which is lifted in the device according to the present invention.
Figure 25B:
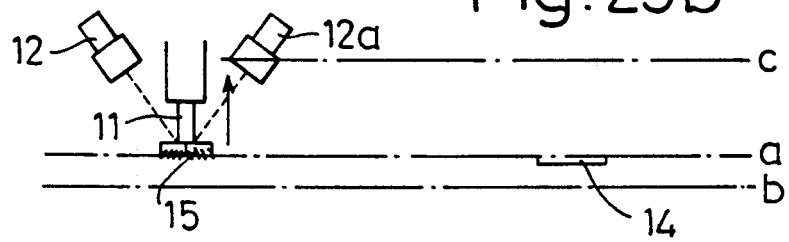
Figure 26A:
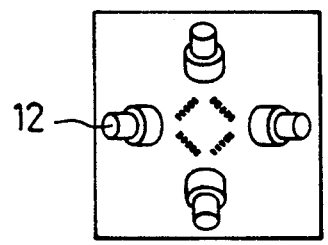
FIGS. 26a and 26b are explanatory views of a state showing the positional alignment between one of the mounting parts and a land pattern on the board in the device according to the present invention.
Figure 26B:
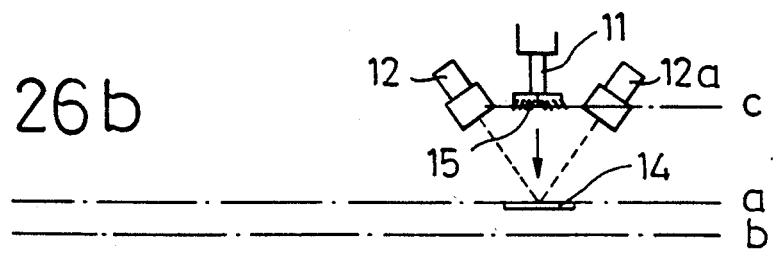
Figure 27:
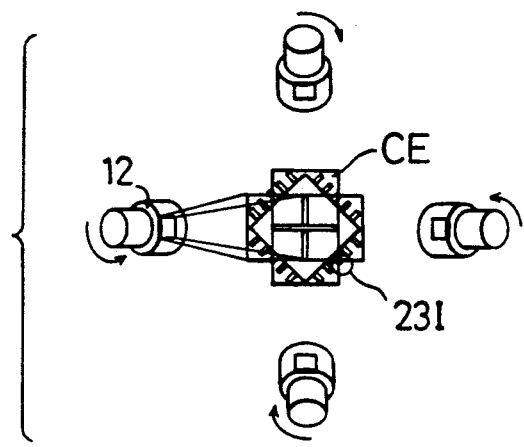
FIGS. 27 and 28 are diagrams showing recognition states of the mounted parts with the cameras in the device according to the present invention.
Figure 28:
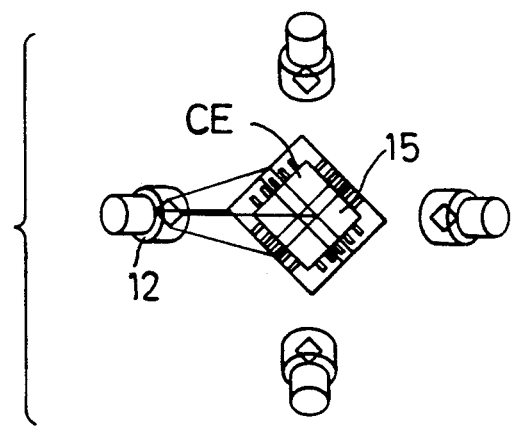

Referring to a process for mounting mounting parts, such as electronic parts, the parts-conveying head 11 is lowered toward the mounting part 15 to a level b on which the part 15 is present, as shown in FIG. 24, the part 15 is drawn up by the head 11 to a recognition level a, and the leads 23 of the part 15 are recognized, as shown in FIG. 25a and 25b. Upon completion of this recognition operation, the head 11 holding the part 15 is elevated to a level c where the head 11 and part 15 are out of the sights of the respective cameras 12 and 12a. The head 11 holding the part 15 is shifted to a mounting position, as shown in FIGS. 26a and 26b, and a board pattern at his position is recognized through the cameras 12 and 12a. An optimum operational process is executed by a comparison between the recognition of the part and board pattern, and the positional alignment of the mounting part 15 with the board pattern is carried out. In recognizing the mounting part 15 and the board 14, a mere disposition of the respective cameras relative to the respective corner edges of the mounted part, as shown in FIG. 27, may cause a risk that, even when four fields of sight CE of the four cameras employed form an image, a part 231 of the leads 23 of the mounting part 15 will not be within the fields of sight of the cameras and will not be detected. As shown by arrows in FIG. 27, therefore, the respective cameras are rotated about their axes to align each outward corner of the fields of sight CE of the cameras 12 and 12a with each corner of the mounting part 15 and any dead angle can be eliminated from the composite image of the four fields of sight, as shown in FIG. 28. Since the recognition for both the mounting part 15 and the board 14 is performed with the common cameras, the recognition for the leads can be executed without passing through recognition points for the respective cameras. This is in contrast to a system in which the cameras are individually provided. Thus, the required positioning time can be shortened and the camera disposition for taking the image diagonally in alignment with the directions of the corners of the mounting part allows a floating state of the leads of the mounting part to be detected highly precisely.

Figure 29:
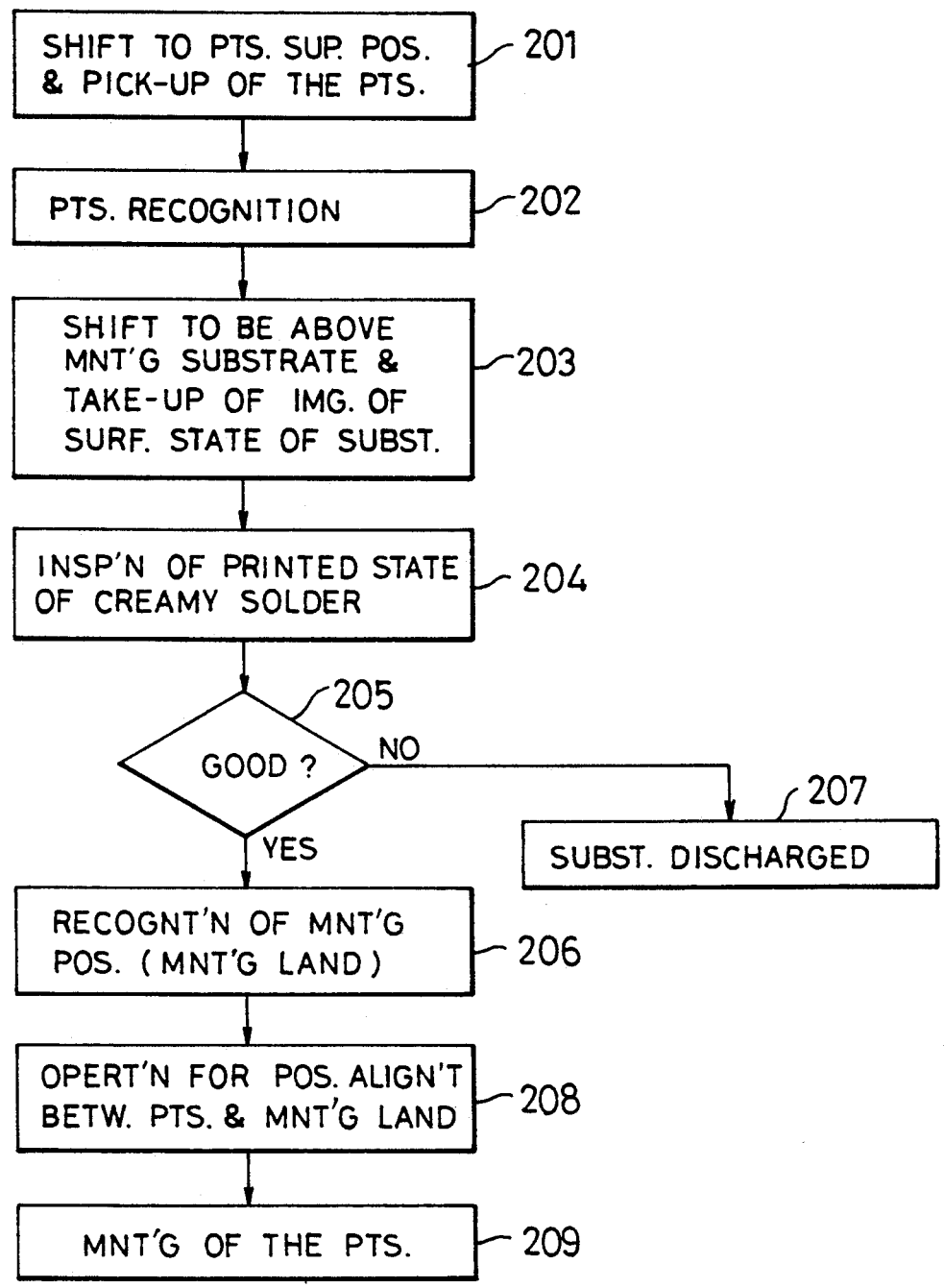
FIG. 29 is a flow chart of a control at a step prior to the mounting of the parts in the device according to the present invention.

Prior to the mounting of the parts, in general, printing of a creamy solder is carried out with a creamy solder printer onto the lands on the printed circuit board for mounting the parts for the purpose of provisionally holding and solder-adhesion of the parts onto the lands. The reliability of the mounting precision and of the board to which the parts are mounted is largely influenced by the quality of the printed creamy solder. In particular, it is difficult to correct any defect in the printed creamy solder for holding and adhesion of mounting parts, such as QFP parts which require a very narrow pitch of the leads, even at post-mounting steps. Accordingly, a parts mounting operation including inspecting the state of the printed creamy solder, as shown in a flow chart in FIG. 29, is employed. The shift of the parts-conveying head to the parts supply position and the pick-up on one part are carried out at step 201, the picked-up part is recognized at step 202, the shift to the position above the mounting substrate or board as well as collection of the image of the surface state of the substrate are performed at step 203, and, thereafter, the state of the printed creamy solder on the substrate is inspected at step 204. At step 205, detection of a "good" state resulting from the inspection allows the operation to advance to step 206 to execute recognition of the mounting position (of the mounting land or lands) on the mounting substrate. Then, positional alignment between the mounting parts and the mounting land is carried out at step 208 and, thereafter, mounting of the parts is performed at step 209. When the "good" state is not detected at step 205, the operation advances to step 207 where the substrate is to be discharged.

The foregoing steps can be executed by recognition means provided, for example, to the parts-conveying head. The quality of the printed creamy solder can be inspected at every mounting point on the mounting substrate before the mounting or only at a limited mounting point or points for certain selected parts.

The image of the surface state of the substrate as viewed from the recognition means presents, as shown in FIG. 30, the surface of the substrate 14 in a dark tone whereas the surface of a preliminary solder-plated surface of the mounting land 17 is presented in a bright tone and the surface of the printed creamy solder is given in an intermediate tone between those of the substrate 14 and the mounting land 17 and, in view of such distinctions in tone, the brightness can be obtained from the image information. Further, while the printing of the creamy solder is carried out on the mounting lands 17, the extraction of the mounting lands becomes impossible when the mounting lands are positioned under the creamy solder since the definition of the mounting lands is carried out from the position of the mounting lands. It is desirable that the printing of the creamy solder be carried out from an end surface of the mounting lands 17 toward the inner side of them whereby the recognition of at least three corners of the land 17 is enabled even when the printed creamy solder involves any positional deviation and, since the mounting lands are generally square-shaped, the position of the mounting lands can be accurately defined from the three corners already recognized.

In practice, as shown in FIGS. 31a and 31b, the mounting position for the respective parts is to be defined such that the square shape definable from three extracted corner points a, b, and c of one of the lands 17 is imagined, the center of this square shape is obtained as the center position of the mounting land, another center position of another mounting land is similarly obtained, and both center positions are compared with each other to define the mounting position in view of the relative positions of the two lands compared. With the distinction in the brightness of the creamy solder, information on the creamy solder is extracted from the image information, the area and center positions of the printed creamy solder are obtained and compared with the above-center position of the mounts land to inspect any positional deviation of the printed solder, and, when the land is excessively covered by the solder, as shown in FIG. 31a, to the extent of exceeding a predetermined area ratio relative to the land, the printed creamy solder is determined to be defective. Therefore, the proper positioning of the printed creamy solder can be precisely determined.

Figure 32:
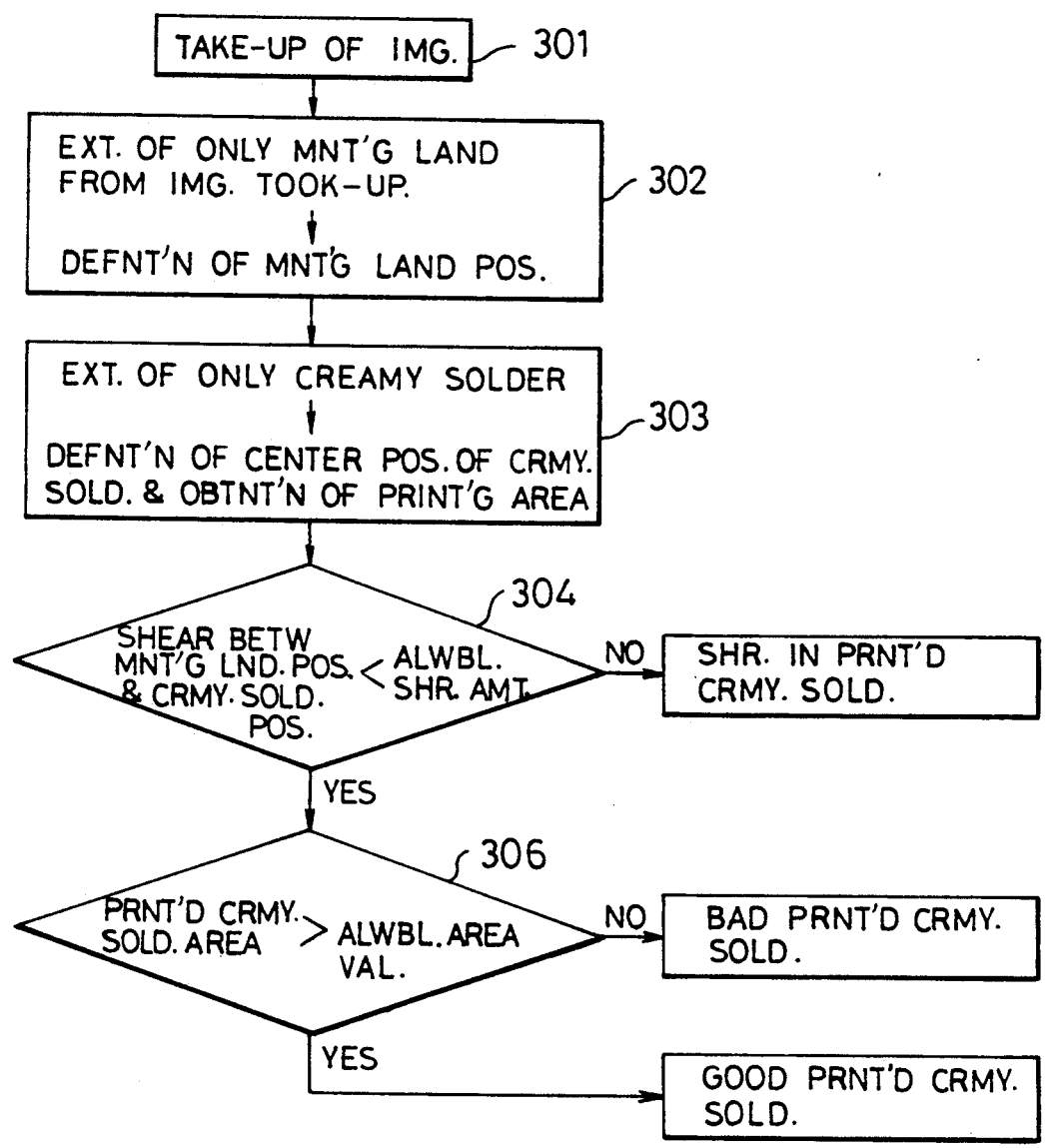
FIG. 32 is a flow chart of an inspection of the printed state of the creamy solder.

In practice, as seen in FIGS. 31a and 31b, a quadrilateral which may be defined with properly selectively extracted three corner points a, b, and c of the quadrilateral is imagined, the center of this quadrilateral is obtained which is the center position of the mounting land. Similarly, the center positions of a plurality of opposing mounting lands are obtained, and the mounting positions of the parts can be defined from the positions relating to the mounting lands. Next, the printed creamy solder is extracted from the image information on the basis of the distinction in the brightness of the creamy solder, the surface area and center position of the extracted creamy solder are obtained, and any shear in the printed creamy solder in comparison to the center position of the mounting land is inspected so that, when the land is excessively covered by the creamy solder and exceeds the preliminarily set area-ratio with respect to the land, the printed creamy solder is discriminated to be bad. In this manner, the good or bad state of the printed creamy solder can be precisely discriminated. More specifically, respective steps for discriminating the state of the printed creamy solder on the basis of the positions and areas of the mounting land and the printed creamy solder are carried out according to the flow chart shown in FIG. 32.

In step 301, the image of the printed circuit board or substrate is recorded. In step 302, the information on the mounting land is extracted from the image previously recorded to define the position of the mounting land. In step 303, the information on the printed area of the creamy solder is extracted and the center position of the creamy solder is defined. In step 304, it is discriminated whether any shear between the mounting land position and the printed creamy solder position is smaller than an allowable shear amount. If the result is yes, it is further discriminated at a next step 306 whether the printed creamy solder area is smaller than an allowable area value. If the shear between the mounting land position and the printed creamy solder position is larger than the allowable shear amount as a result of the discrimination at step 304, it is also determined that the printed creamy solder involves the shear. A discrimination that the printed solder area is smaller than the allowable area value determines that the state of the printed creamy solder is excellent. A determination that the printed solder area is larger than the allowable area value determines the state to be bad.

FIG. 33 shows another embodiment of the parts mounting device according to the present invention in which the parts-conveying head 41 and cameras 42 and 42a are shiftable in X and Y directions while the head 41 is also movable in a vertical Z direction. The printed circuit board or substrate 44 is placed on a substrate carrier 44a which is shiftable in horizontal X and Y directions. In the device shown in FIG. 33, all other arrangements are similar to those in the device shown in FIG. 1 and the same constituents of the device in FIG. 33 as those in the device of FIG. 1 are denoted by the same reference numerals as those in FIG. 1 but as added by 30. Now, references shall be made to the parts-mounting operation of the device of FIG. 33 with respect to the substrate 44 in accordance with a flow chart of FIG. 39 in conjunction with FIGS. 34–38.

Figure 35:
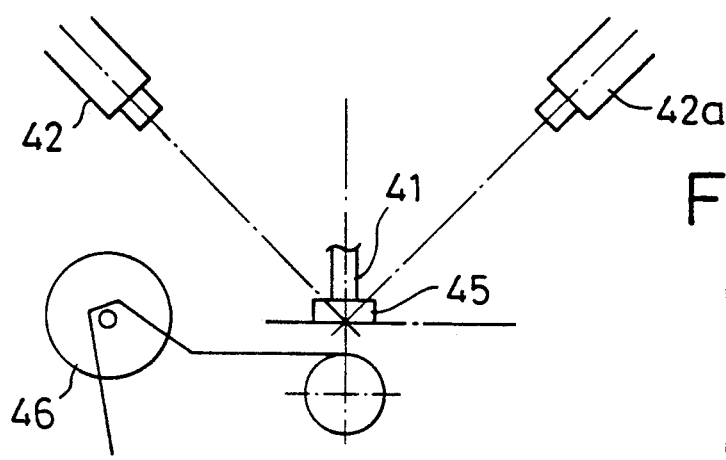
FIG. 35 is an explanatory view for an operation of a parts recognition means in the device according to the present invention.
Figure 36:
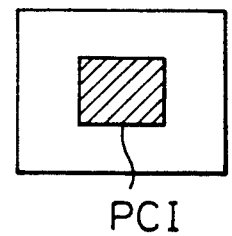
FIG. 36 is a diagram showing a composite image of one of the mounting parts obtained with the recognition means of FIG. 35.
Figure 39:
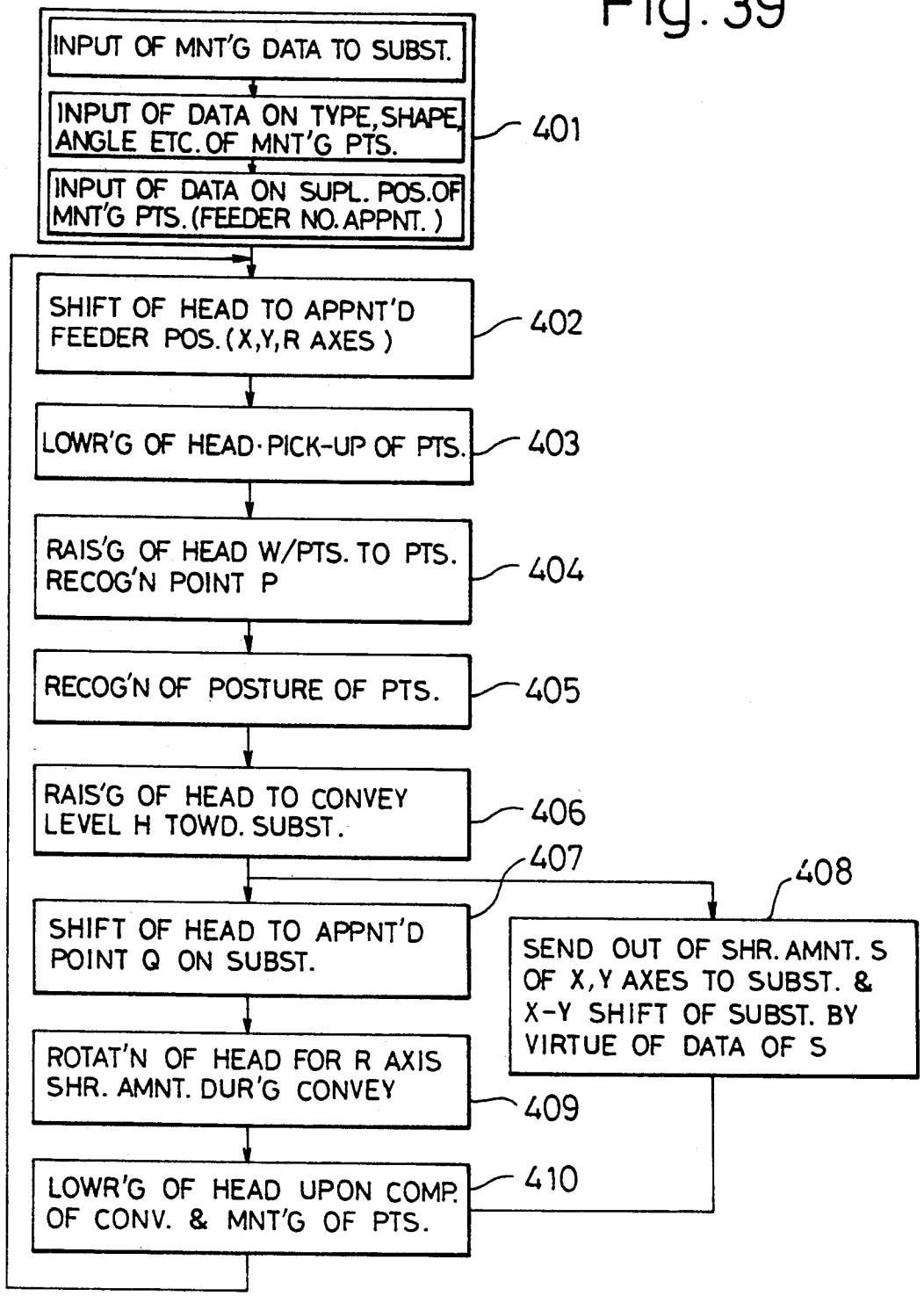
FIG. 39 is a flow chart of a high-speed mounting process in the device according to the present invention from the pick-up of one of the mounting parts to completion of the mounting onto the board.

At step 401, shown in FIG. 39, an operator of the device preliminarily inputs onto the side of the mounting device having the parts-conveying head 41 the data for mounting the parts to the substrate 44 or data of the mounting part 45, such as type, shape, angle, and so on as well as the parts supply position data of the mounting part 45. The substrate 44 provided with lands 47, as shown in FIG. 34, is mounted on the substrate carrier 44a. A corner of the substrate represents a standard position (O, O) for determination of positional relationship. At step 402, the parts-conveying head 41 is shifted in the X and Y directions toward an appointed position of the parts feeder 46. At step 403, the head 41 is lowered and the mounting part 45 at the appointed position is picked up by suction. At step 404, the head 41 carrying the mounting part 45 is raised so that its lower surface is flush with a level of the parts recognition point PP, the level conforming to the image focusing plane of the cameras 42 and 42a. As shown in FIG. 35, the mounting part 45 picked up from the feeder 46 to the head 41 by a suction means associated with the head 41 is raised to the same height as the focusing plane of the cameras 42 and 42a at the lower surface of the mounting parts 45, and the state of the part 45 is recorded by the cameras as a picked-up parts image PCI, as shown in FIG. 36.

Figure 37:
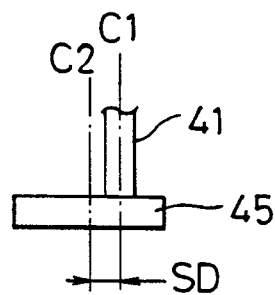
FIGS. 37 and 38 are diagrams showing a positional deviation or shear between the center of the parts-conveying head and the center of one of the mounting parts in the device according to the present invention.
Figure 38:
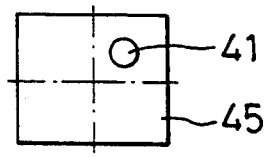

At step 405, posture recognition is carried out with respect to the mounting part 45 on the head 41, any shear between the center points of the head 41 and the mounting part 45 is obtained, and, thereafter, at step 406, the head 41 carrying the mounting part 45 is further raised to the level of a height H at which the parts-conveying head 41 with the part 45 is shifted toward the substrate 44. Then, at step 407, the head 41 with the mounting part 45 is shifted to an appointed position BP on the substrate 44, that is, the mounting data position according to an operator's input. Simultaneously, at step 408, the shear amount or distance in the X and Y directions between the head 41 and the mounting part 45, as shown in FIGS. 37 and 38, that is, data of the difference in the X and Y directions between the center C1 of the parts-conveying head 41 and the center C2 of the mounting part 45 being conveyed by the head, is sent out to the substrate carrier 44a as a shifting amount of the carrier 44a and the substrate 44 is properly shifted in the X and Y directions by virtue of the difference data. At this time, absence of such shear, that is, coincidence of the center C1 of the head 41 with the center C2 of the mounting part 45, requires no positional correction on the side of the substrate 44.

At step 409, the head 41 carrying the mounting part 45 is axially rotated by an extent corresponding to a shear in the rotary direction R of the head during the foregoing shift toward the parts mounting position. Thereafter, at step 410, the shift of the head 41 carrying the part 45 is completed, the head 41 is lowered, and the part 45 is mounted. In this way, required correction for the shear of the mounting part 45 is realized during the shift of the parts-conveying head 41 so that the lowering operation of the head 41 and mounting part 45 can be started immediately after the completion of the shift of the head to the mounting position of the part 45, i.e., the appointed position BP for the mounting part 45 as shown in FIG. 33. Consequently, there is no time loss in contrast to any known device.

Figure 40:
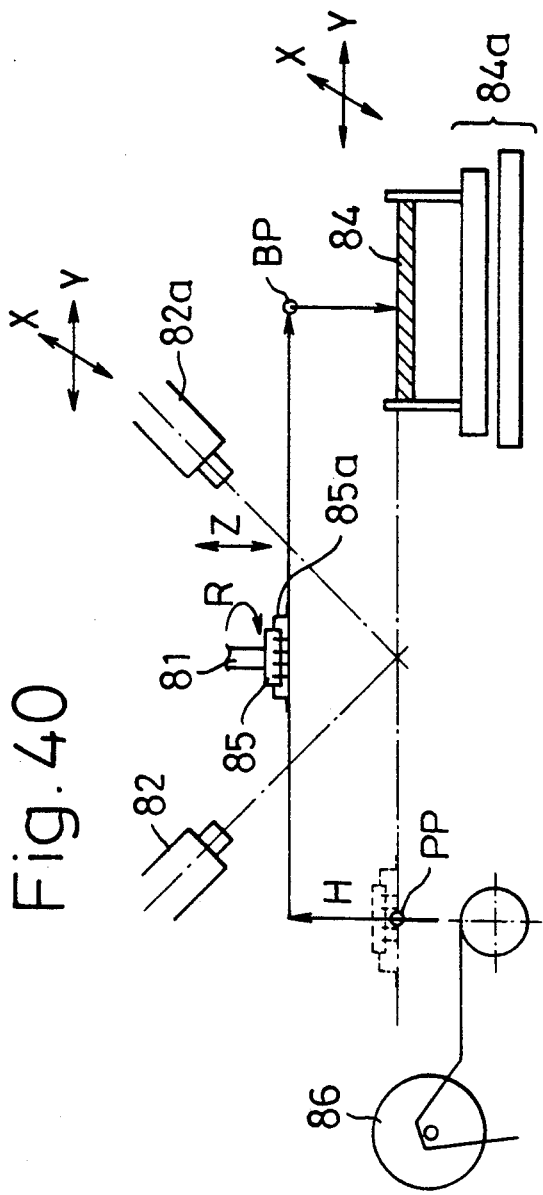
FIG. 40 is an explanatory view for a mounting operation in still another embodiment of the parts mounting device according to the present invention.

FIG. 40 shows a further embodiment of the parts mounting device according to the present invention in which the device for the parts mounting operation of the mounting part 85 having the leads 85a requires very precise mounting. In this case, the mounting part 85 at the parts recognition point PP is recognized by carrying out the image focusing of the cameras 82 and 82a at the lower surface at bent portions of the respective leads 85a of the mounting part 85. Other arrangements in the device shown in FIG. 40 are the same as those in the embodiment of FIG. 1 and the same constituents as those in the device of FIG. 1 are denoted in FIG. 40 by the same reference numerals as in FIG. 1 but as added by 70.

Figure 41:
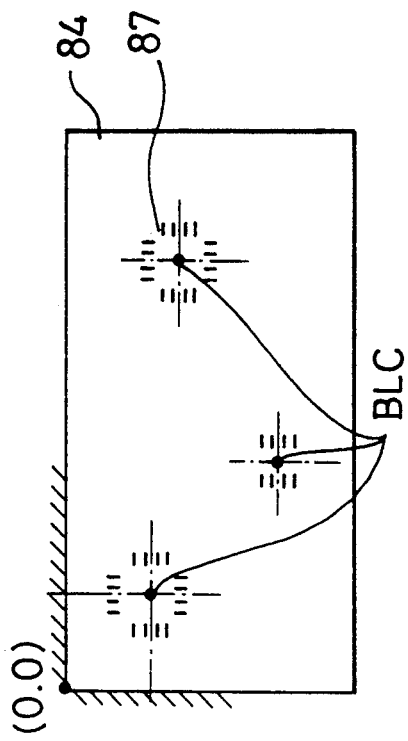
FIG. 41 is a diagram showing the relationship between the standard position and the mounting position of a mounting part having leads on the board in the device according to the present invention.

In the present embodiment, the positional relationship between the standard position of the substrate 84 and the mounting position for the mounting part 85 is determined by placing the substrate 84 with the lands 87, as shown in FIG. 41, on the substrate carrier 84a and representing the standard position (O, O) by one of the corners of the substrate 84. Here, any positional shear between the parts-conveying head 81 and the mounting part 85 is obtained through a computation of shearing extent in the X and Y directions between the centers C1 and C2 of the parts-conveying head 81 and the mounting part 85, as shown in FIGS. 42 and 43. In the present embodiment, the cameras 82 and 82a take the image of the lands 87 on the substrate 84 to which lands of the mounting part 85 having the leads 85a are mounted, as shown in FIG. 44. Here, reference numerals 87A, 87B, and 87C denote the mounting lands to which the leads 85a of the respective mounting parts 85 are to be mounted and connected. Similar to the foregoing embodiment of FIG. 33 and in addition to detection of the positional shear between the partsconveying head 81 and the mounting part 85, a shear amount BLC' between the center C1' of the head 81 and the center C2' of the lands 87 on the substrate 84 is also detected, and the respective shear amounts are effectively corrected. While, in this case, the lands 87 on the substrate 84 are shown in a rectangular shape for convenience of illustration and description, the lands can be provided in arrays of smaller divided land portions in conformity to the number and arrays of the leads 85a of the mounting part 85, as shown in FIG. 41.

Figure 46:
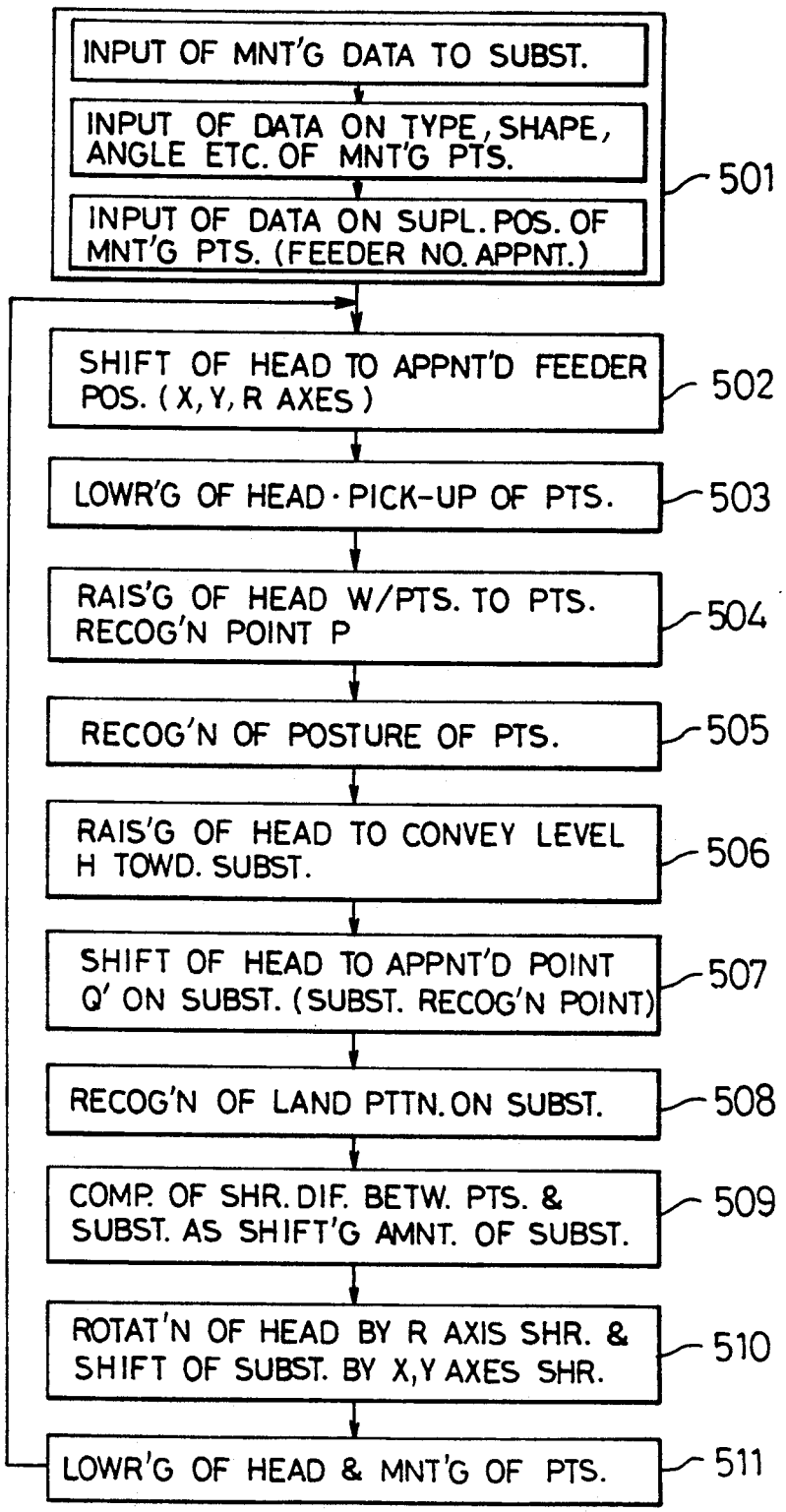
FIG. 46 is a flow chart of a high precision mounting process in the device according to the present invention from pick-up of one of the mounting parts to completion of the mounting of the mounting part to the board.

The parts mounting operation relative to the substrate 84 is now described with reference to a flow chart of FIG. 46 in which steps 501 to 504 are the same as the foregoing steps 401 to 404. At step 505, position recognition of the mounting part 85 is carried out at the parts recognition point PP, as shown in FIG. 40, and any positional shear amount between the parts-conveying head 81 and the mounting part 85 carried by the head is obtained. At step 508, as partially described above, the lands 87 on the substrate 84 are recognized at the substrate recognition point, as shown in FIGS. 44 and 45, and the shear amount BLC' between the centers of the parts-conveying head 81 and the lands 87 is obtained. Next, at step 509, the shear amount between the substrate 84 and the mounting part 85 is computed as the shifting amount for the substrate 84. At step 510, the head 81 is axially rotated by an extent corresponding to the shear amount in the R direction and the substrate 84 is shifted for the shear amount in the X and Y directions. Thereafter, at step 511, the head 81 is lowered and the part 85 is mounted.

According to the embodiments shown in FIGS. 40-46, the shifting operation is shared by the parts-conveying head 81 and the substrate 84 so that a shift that demands much higher precision is executed on the side of the substrate while a shift that does not demand such high precision is carried out on the side of the parts-conveying head so that the required correction can be performed with a relatively short stroke of the shift.

Figure 48A:
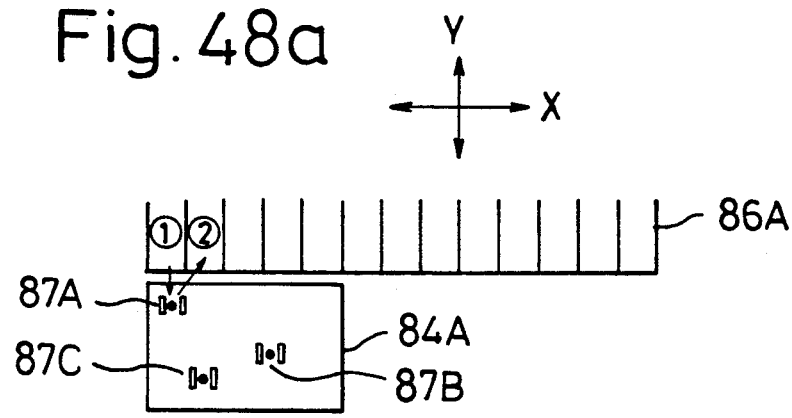
FIGS. 48a, 48b, and 48c in sequential diagrams the relationship between the parts supply position and shifting positions of the printed circuit board in the device according to the present invention.

According to a remarkable feature of the parts mounting device of the present invention, it is possible to mount the parts onto the printed circuit board or substrate with a minimum distance between the substrate and the part supply feeder and mounting can be performed smoothly and quickly. Explaining the parts mounting operation of the substrate with reference to a flow chart of FIG. 47 in conjunction with the sequential views of FIG. 48, the parts-conveying head is shifted at step 601 to a parts supply position of the first mounting part in the feeder 86A, as shown in FIG. 48a. At step 602, the X directional data of the mounting point data on the side of the substrate 84 conform to the X directional data of the supply position for the first mounting part, the Y directional data of the mounting point data are specific common data close to the feeder 86A, and the center of the feeder 86A is positioned with respect to the centers of each of the lands 87A, 87B, and 87C on the substrate 84A. At step 604, the shift of the substrate 84A is carried out according to the X and Y directional data and the operation is advanced to step 606.

Alternatively, at step 603, the parts-conveying head is lowered to pick up the first mounting part from the feeder 86A by suction. At step 605, the head with the first mounting part thereon is shifted in the Y direction by a fixed amount. Then, at step 606, the head carrying the first mounting part is lowered again and the first mounting part is mounted onto the land 87A on the substrate 84A. Step 606 is similarly carried out upon completion of the above-described step 604. Next, at step 607, a head with no mounting part is shifted to a next supply position of a second of the mounting parts, a shown in FIG. 46b. At step 608, the X directional data of the mounting point data on the side of the substrate conform to the X directional data of the second mounting part while the Y directional data of the mounting point data are specific common data close to the feeder 86A. At step 610, the substrate 84A is shifted in accordance with the X and Y directional data and the operation is advanced to a final step 612.

Upon completion of step 607, the head with no mounting part is lowered at step 609 to pick up the second mounting part from the feeder 86A by suction, and, at step 611, the head carrying the second mounting part is shifted by a fixed amount in the Y direction. Thereafter, at the final step 612, the head is lowered to mount the second mounting part to another land 87B on the substrate 84A. Step 612 is also carried out after the foregoing step 610. In the same manner as described above, the mounting operation is repeated for mounting a third mounting part to still another land 87C on the substrate 84A, as shown in FIG. 48C.

Figure 48B:
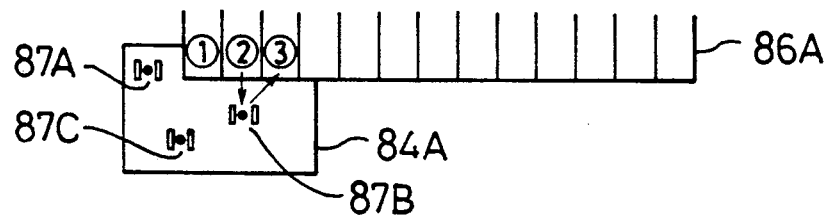
Figure 48C:
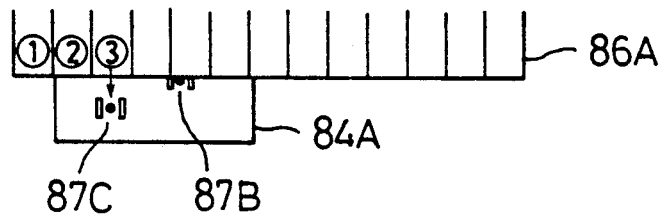

It will be readily appreciated that the arrangement disclosed with reference to FIGS. 47 and 48 are applicable to any of the foregoing embodiments.

We claim:
1. A parts mounting device comprising:
a displaceable base;
a parts-conveying head, mounted on the displaceable base, for picking up a mounting part from a mounting parts supply means and conveying said mounting part to a predetermined mounting position on a board having mounting lands to which the mounting part is to be mounted;
recognition means, mounted on the displaceable base, for recognizing said mounting part and said mounting lands located in a focus plane, the parts-conveying head providing a standard reference position for the recognition within the focus plane; and
means for discriminating a positional relationship between the mounting part and the mounting lands and for aligning the position of the mounting part relative to the mounting lands.
2. The device according to claim 1 which further comprises means for comparing a state in which said mounting part is picked up with a state in which the mounting part is mounted and means for discriminating the proper positioning of said mounted state.
3. The device according to claim 2 wherein said means for discriminating said proper positioning of the mounted state of said mounting part is included in said recognition means.
4. The device according to claim 1 wherein said recognition means includes a plurality of cameras focusing on the focus plane including a surface of said board on which said mounting part is mounted.

5. The device according to claim 1 wherein said recognition means includes at least two cameras, symmetrically mounted on said base with respect to the parts-conveying head, for shifting their fields of sight.

6. The device according to claim 5 wherein said recognition means further includes a jig, an image of said jig being taken by said two cameras, allowing a mutual positional relationship of the cameras to be defined for carrying out said mounting of said mounting part.

7. The device according to claim 2 which further comprises means for inspecting a state in which a creamy solder is printed onto said lands prior to said positional alignment of said mounting part with respect to said corresponding mounting lands.

8. The device according to claim 7 wherein said inspecting means and said means for discriminating said proper positioning of said mounted state is included in the recognition means.

9. The device according to claim 7 wherein said inspecting means is provided for discriminating the proper positioning of said creamy solder in view of a positional and an area relationship between said lands and the creamy solder.

10. The device according to claim 1 which further comprises means for shifting said board, the board being shifted during said conveying of said parts-conveying head, using a deviation between the parts-conveying head and said mounting part to determine a shifting amount, and means for correcting a positional relationship between the parts-conveying head and said mounting lands on the board.

11. The device according to claim 10 wherein said recognition means obtains a deviation between said parts-conveying head and said mounting lands, for shifting the board by a shifting amount equal to a difference between said deviation of the parts-conveying head and the mounting lands and said deviation of the parts-conveying head and mounting part.

12. The device according to claim 11 which further comprises means for minimizing a conveying distance of said parts-conveying head from a position where said mounting part is picked up from said mounting parts supply means to a position where the mounting part is mounted to said board with said shifting of the board.

13. A parts mounting device for picking up a mounting part from a mounting parts supply means and for conveying the mounting part to a predetermined mounting position on a board having mounting lands to which the mounting part is to be mounted, the parts mounting device comprising:

a parts-conveying head for placing the mounting part, the parts-conveying head having a first position and a second position;

recognition means for recognizing the mounting part while the parts-conveying head is in the first position, and for recognizing the mounting lands while the parts-conveying head is in the second position and before the mounting part is mounted on the board, the recognition means having a single focusing plane corresponding to the first position; and means for discriminating a positional relationship between the mounting part and the mounting lands and for aligning the position of the mounting part relative to the mounting lands.

14. The device according to claim 13 wherein the recognition means includes a plurality of cameras positioned at an angle and directed at the single focusing plane, thereby allowing each camera to have a reduced sight and higher resolution.

15. The device according to claim 13 wherein the recognition means includes a plurality of cameras directed at the single focusing plane position, the sight position of the cameras relative to the parts-conveying head being adjustable for accommodating size variations of the mounting part.

16. The device according to claim 14 wherein two cameras are used, each camera sight respectively being centered on opposed corners of the mounting part.

17. The device according to claim 13 wherein the partsconveying head is movable in three dimensions, the board is independently movable in two dimensions, and the means for aligning is accomplished by moving the board.

18. The device according to claim 13 wherein the mounting lands include dents.

19. The device according to claim 13 where the mounting lands located on first and second sides of the mounting part include dents respectively oriented in two traverse directions.

* * * * *